United States Patent
Pan

(10) Patent No.: US 11,175,575 B2
(45) Date of Patent: Nov. 16, 2021

(54) ILLUMINATION SYSTEM, ILLUMINATION CONTROL METHOD AND PROJECTION APPARATUS

(71) Applicant: Coretronic Corporation, Hsin-Chu (TW)

(72) Inventor: Haw-Woei Pan, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 0 days.

(21) Appl. No.: 17/163,561

(22) Filed: Feb. 1, 2021

(65) Prior Publication Data

US 2021/0255532 A1  Aug. 19, 2021

(30) Foreign Application Priority Data

Feb. 13, 2020 (CN) .......................... 202010089823.1

(51) Int. Cl.
  *G03B 21/20* (2006.01)
  *G02B 26/00* (2006.01)
(52) U.S. Cl.
  CPC ......... *G03B 21/204* (2013.01); *G02B 26/008* (2013.01)
(58) Field of Classification Search
  CPC ........................... G02B 216/008; G03B 21/204
  See application file for complete search history.

(56) References Cited

U.S. PATENT DOCUMENTS

| 11,022,867 | B2* | 6/2021 | Liu | ........ G03B 21/005 |
| 2005/0078387 | A1 | 4/2005 | Maeda | |
| 2010/0328626 | A1 | 12/2010 | Miyazaki | |
| 2018/0173087 | A1 | 6/2018 | Hsieh et al. | |
| 2018/0343425 | A1 | 11/2018 | Liao et al. | |

FOREIGN PATENT DOCUMENTS

| CN | 101937166 | 1/2011 |
| CN | 107430319 | 12/2017 |
| CN | 209707898 | 11/2019 |
| CN | 209765253 | 12/2019 |
| EP | 3561594 | 10/2019 |
| TW | 201822184 | 6/2018 |
| TW | 201932969 | 8/2019 |

OTHER PUBLICATIONS

"Search Report of Europe Counterpart Application", dated Jun. 22, 2021, p. 1-p. 11.

* cited by examiner

*Primary Examiner* — Anne M Hines
(74) *Attorney, Agent, or Firm* — JCIPRNET

(57) ABSTRACT

An illumination system including a first laser light source, a second laser light source, and a wavelength conversion module is provided. The first laser light source provides a first laser light beam in a first time interval and a third time interval. The wavelength conversion module is located on a transmission path of the first laser light beam. The wavelength conversion module includes at least one wavelength conversion region, at least one non-conversion region, a first standby region, and a second standby region, and is configured to rotate along a rotating shaft, so that the wavelength conversion region, the first standby region, the non-conversion region, and the second standby region are sequentially rotated in one direction, and the wavelength conversion region and the non-conversion region are alternately cut into the transmission path of the first laser light beam. An illumination control method and a projection apparatus are also provided.

22 Claims, 15 Drawing Sheets

ILLUMINATION SYSTEM, ILLUMINATION CONTROL METHOD AND PROJECTION APPARATUS

CROSS-REFERENCE TO RELATED APPLICATION

This application claims the priority benefit of China application serial no. 202010089823.1, filed on Feb. 13, 2020. The entirety of the above-mentioned patent application is hereby incorporated by reference herein and made a part of this specification.

BACKGROUND

Technical Field

The invention relates to an optical system, an optical control method, and an optical apparatus, and particularly relates to an illumination system, an illumination control method, and a projection apparatus.

Description of Related Art

Recently, projection apparatuses based on solid-state light sources such as light-emitting diodes (LEDs) and laser diodes have gradually gained a place in the market. Generally, excitation light of the solid-state light sources is converted by a wavelength conversion material on a wavelength conversion module in a projection apparatus to generate converted light of different colors. In addition, in order to meet requirements on color performance, a filter module is placed on a rear light path of the projection apparatus, and the filter module filters the converted light of the wavelength conversion module to produce color light of predetermined colors. The color light is modulated by a light valve to produce an image light beam for projecting to external.

Generally, since a wavelength conversion element of the wavelength conversion module has a boundary of a wavelength conversion region and a non-conversion region, when the excitation light is incident to a region near the boundary, and a part of the excitation light is in the wavelength conversion region and a part of the excitation light is in the non-conversion region, such state is generally referred to as a spoke state, which may result in a phenomenon of image discoloration. This is because that the wavelength conversion element is continually rotated, and a ratio of the excitation light incident to the wavelength conversion region and incident to the non-conversion region is changed along with time, so that a light beam emitted from the wavelength conversion element may form converted light and non-converted light with unstable intensity. Therefore, when the wavelength conversion element is rotated to the spoke state, the light valve in operation in the projection apparatus is temporarily turned off to avoid producing image discoloration. However, in this way, the projection apparatus may lose brightness of a display image.

Moreover, in order to improve a color update rate of the projection apparatus to reduce a color break issue in human visual perception, and achieve smoother viewing quality, technical measures taken by the known projection apparatuses are mostly to increase a number of rotations of the wavelength conversion element and increase a number of divisions of the wavelength conversion regions and the non-conversion regions on the wavelength conversion element. However, in this way, while the number of divisions of the wavelength conversion regions and the non-conversion regions are increased, a frequency of passing through the spoke state is also increased. Therefore, in order to maintain a certain brightness of the display image, the color update rate and the number of the wavelength conversion regions and the non-conversion regions of the projection apparatus have to be limited.

The information disclosed in this Background section is only for enhancement of understanding of the background of the described technology and therefore it may contain information that does not form the prior art that is already known to a person of ordinary skill in the art. Further, the information disclosed in the Background section does not mean that one or more problems to be resolved by one or more embodiments of the invention was acknowledged by a person of ordinary skill in the art.

SUMMARY

The invention is directed to an illumination system, which is adapted to provide display images with good quality.

The invention is directed to a projection apparatus, which is adapted to provide display images with good quality.

The invention is directed to an illumination control method, which controls the projection apparatus to provide display images with good quality.

Other objects and advantages of the invention may be further illustrated by the technical features broadly embodied and described as follows.

In order to achieve one or a portion of or all of the objects or other objects, an embodiment of the invention provides an illumination system. The illumination system is configured to provide an illumination light beam, and the illumination system includes a first laser light source, a second laser light source, and a wavelength conversion module. The first laser light source provides a first laser light beam in a first time interval and a third time interval. The second laser light source provides a second laser light beam in a second time interval and a fourth time interval. The wavelength conversion module is located on a transmission path of the first laser light beam, and the wavelength conversion module has at least one wavelength conversion region and at least one non-conversion region. A first standby region and a second standby region are formed between the at least one wavelength conversion region and the at least one non-conversion region. The wavelength conversion module is configured to rotate along a rotating shaft, so that the at least one wavelength conversion region, the first standby region, the at least one non-conversion region, and the second standby region are sequentially rotated in one direction, and the at least one wavelength conversion region and the at least one non-conversion region are alternately cut into the transmission path of the first laser light beam. When the wavelength conversion module is rotated, in the first time interval, the first laser light beam is incident to the at least one non-conversion region of the wavelength conversion module to form first color light, in the second time interval and the fourth time interval, the second laser light beam forms second color light, and in the third time interval, the first laser light beam is incident to the wavelength conversion region of the wavelength conversion module to form third color light, and in the second time interval and the fourth time interval, the first standby region and the second standby region are respectively cut into the transmission path of the first laser light beam formed in the first time interval or the third time interval, and no light spot is formed on the wavelength conversion module by the first laser light beam.

In order to achieve one or a portion of or all of the objects or other objects, an embodiment of the invention provides a projection apparatus. The projection apparatus includes the aforementioned illumination system, a light valve and a projection lens. The light valve is located on a transmission path of the illumination light beam and is configured to convert the illumination light beam into an image light beam. The projection lens is located on a transmission path of the image light beam and is configured to project the image light beam out of the projection apparatus.

In order to achieve one or a portion of or all of the objects or other objects, an embodiment of the invention provides an illumination control method. The illumination control method is configured to control an illumination system in a projection apparatus. The illumination system includes a first laser light source, a second laser light source, and a wavelength conversion module. The first laser light source is configured to provide a first laser light beam, the second laser light source is configured to provide a second laser light beam, and the wavelength conversion module is located on a transmission path of the first laser light beam and has at least one wavelength conversion region and at least one non-conversion region. A first standby region and a second standby region are formed between the at least one wavelength conversion region and the at least one non-conversion region. The wavelength conversion module is configured to rotate along a rotating shaft, so that the at least one wavelength conversion region, the first standby region, the at least one non-conversion region, and the second standby region are sequentially rotated in one direction, and the at least one wavelength conversion region and the at least one non-conversion region are alternately cut into the transmission path of the first laser light beam. The illumination control method includes following steps. In a first time interval, the first laser light source is turned on, and the second laser light source is turned off, wherein the first laser light beam is incident to the at least one non-conversion region of the wavelength conversion module to form first color light. In a second time interval, the second laser light source is turned on, and the first laser light source is turned off, wherein the second laser light beam forms second color light, the first standby region is cut into the transmission path of the first laser light beam formed in the first time interval or a third time interval, and no light spot is formed on the wavelength conversion module by the first laser light beam. In the third time interval, the first laser light source is turned on, and the second laser light source is turned off, wherein the first laser light beam is incident to the at least one wavelength conversion region of the wavelength conversion module to form third color light. In a fourth time interval, the second laser light source is turned on, and the first laser light source is turned off, wherein the second laser light beam forms the second color light, the second standby region is cut into the transmission path of the first laser light beam formed in the first time interval or the third time interval, and no light spot is formed on the wavelength conversion module by the first laser light beam.

Based on the above description, the embodiments of the invention have at least one of following advantages or effects. In the embodiments of the invention, the illumination system and the projection apparatus are capable of producing the required color light at different time intervals through arrangement of the first laser light source, the second laser light source, and the wavelength conversion module. In this way, the phenomenon of image discoloration caused by the spoke state is prevented, and the brightness of the display image is maintained. Moreover, arrangement of a filter module in the projection apparatus and the illumination system may be omitted, so that the loss of brightness is reduced, and a 100% RGB color light output ratio (CLO) is achieved. Moreover, in the embodiments of the invention, the illumination system and the projection apparatus may adopt the illumination control method to simply switch a turn-on or turn-off state of the first laser light source and the second laser light source without limitation, so as to improve the color update rate of the projection apparatus and eliminate the color break issue to achieve smooth viewing quality.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1:
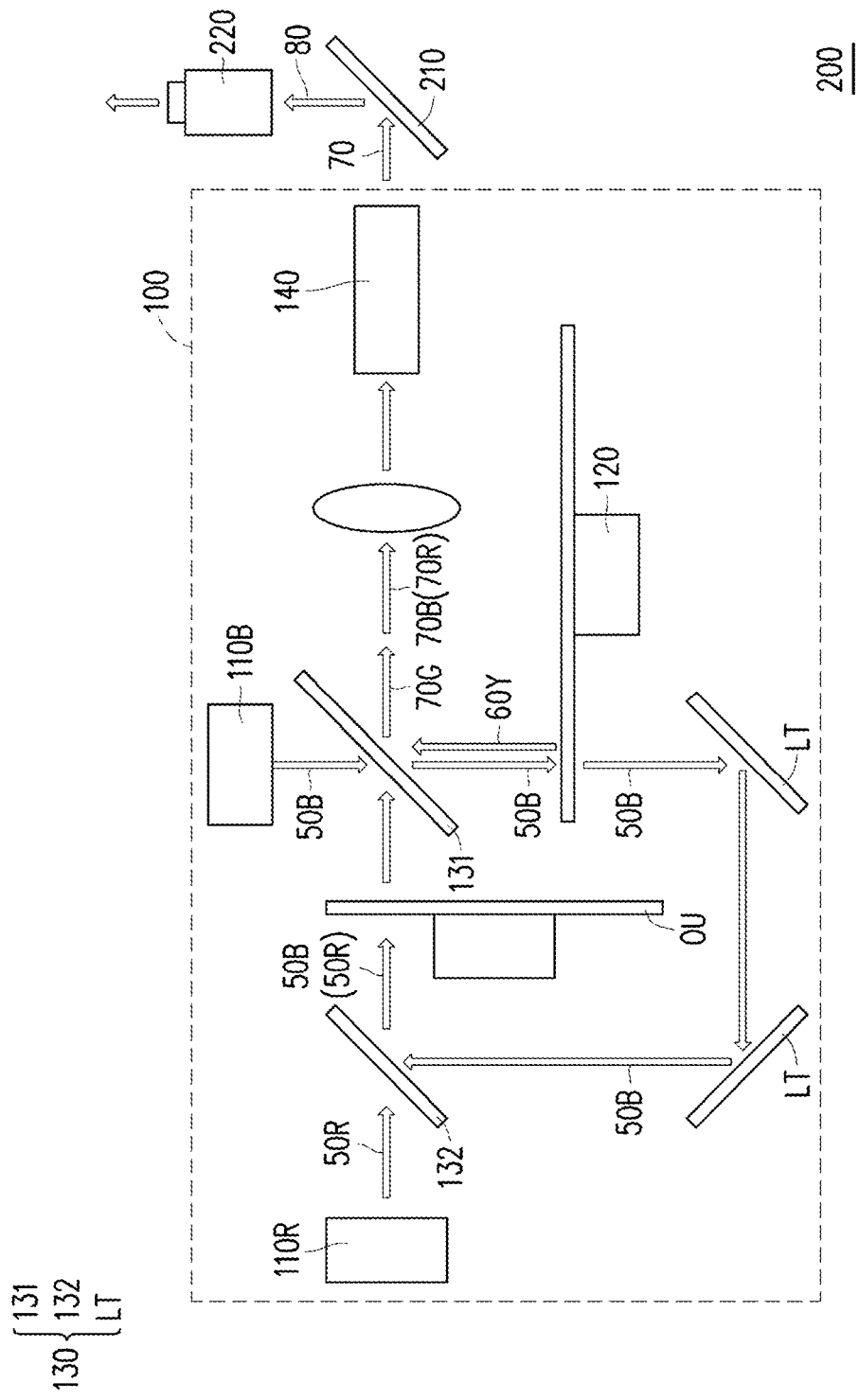
FIG. 1 is a structural schematic diagram of a projection apparatus according to an embodiment of the invention.
Figure 2A:
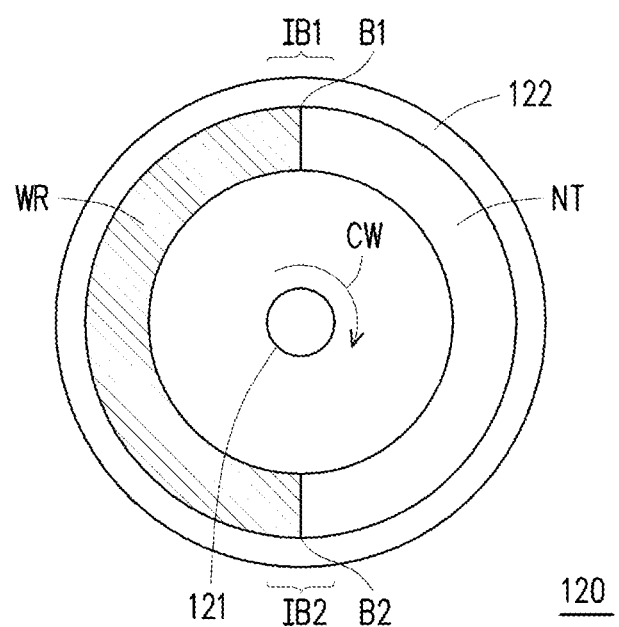
FIG. 2A is a top view of a wavelength conversion module of FIG. 1.
Figure 2B:
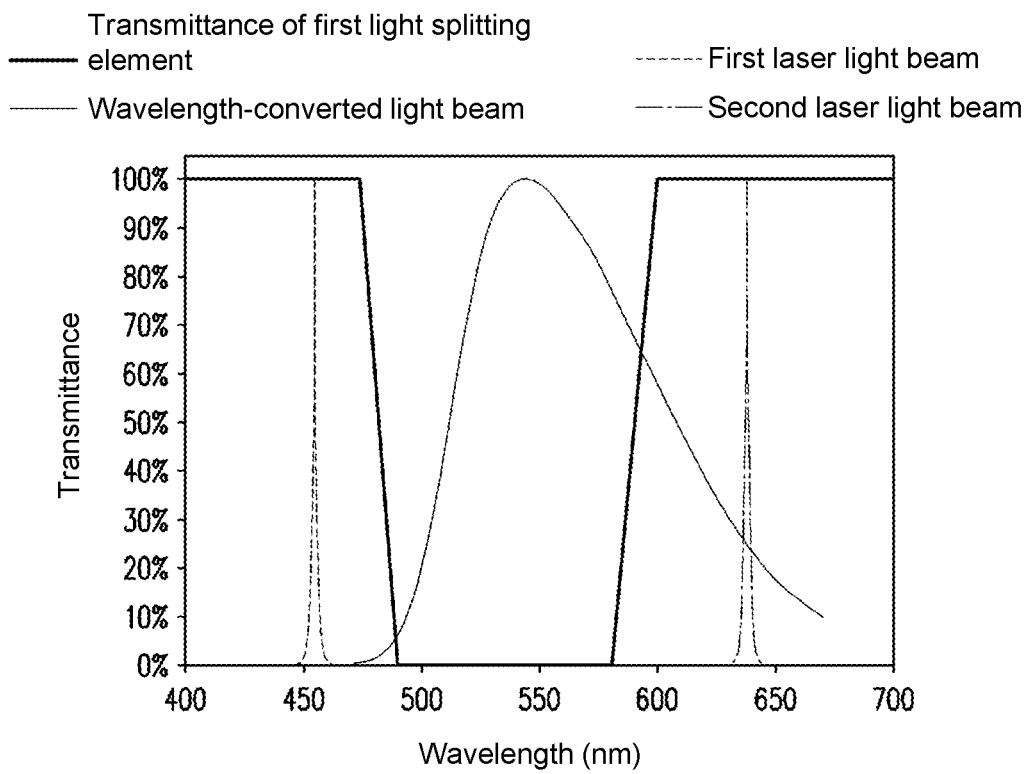
FIG. 2B is a relationship diagram of transmittances of a first light splitting element of FIG. 1 to light of different wavebands.
Figure 2C:
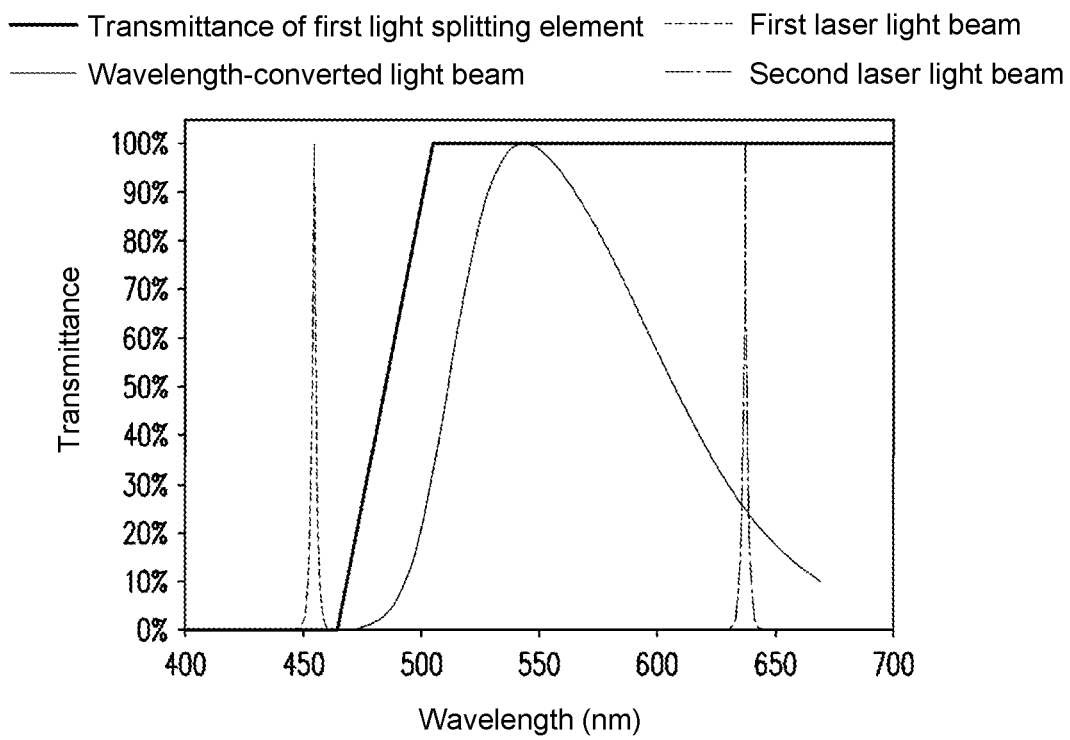
FIG. 2C is a relationship diagram of transmittances of a second light splitting element of FIG. 1 to light of different wavebands.
Figure 2D:
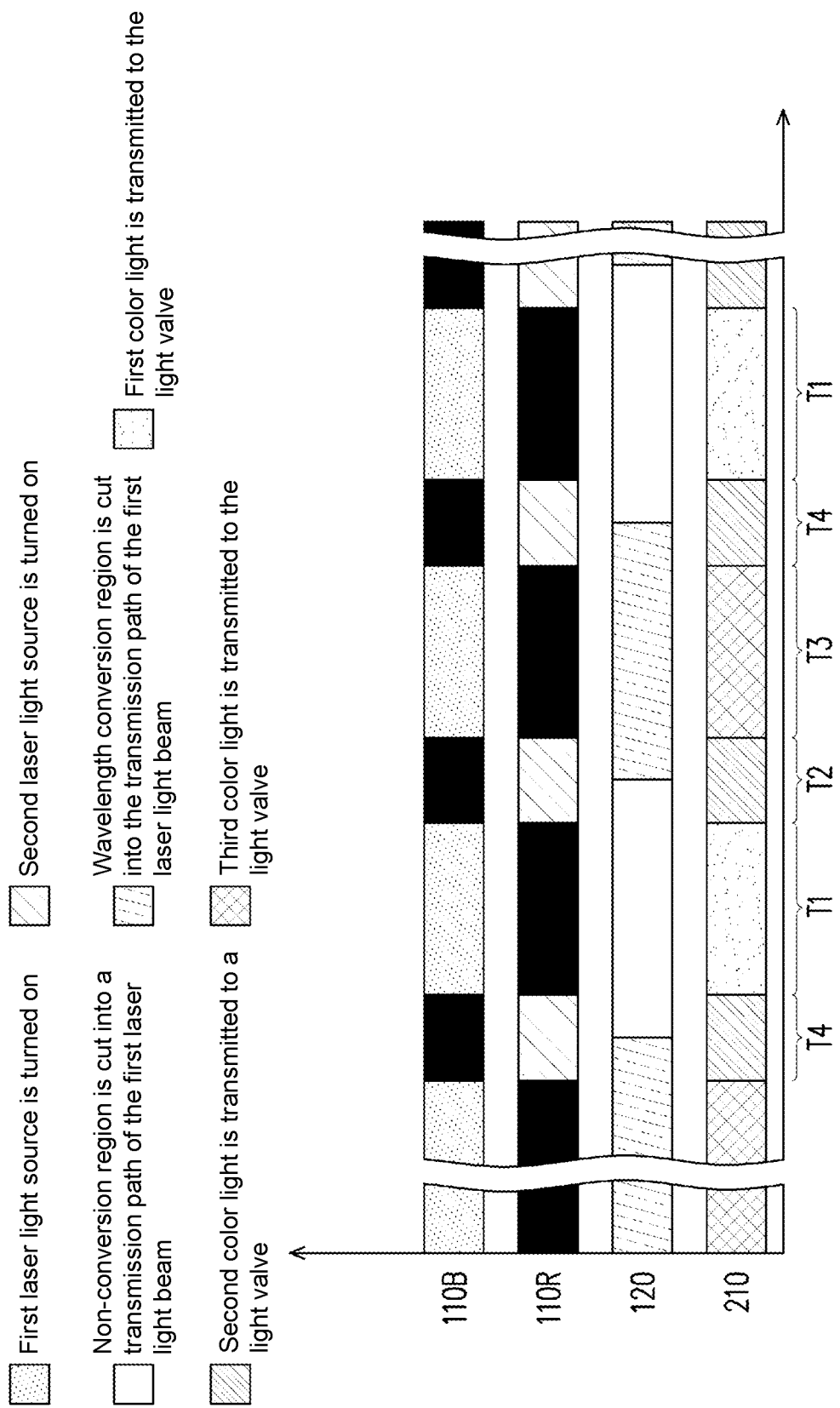
FIG. 2D is a timing schematic diagram of a first laser light source, a second laser light source, a wavelength conversion module and a light valve of FIG. 2A in different time intervals.

FIG. 1 is a structural schematic diagram of a projection apparatus according to an embodiment of the invention. FIG. 2A is a top view of a wavelength conversion module of FIG. 1. FIG. 2B is a relationship diagram of transmittances of a first light splitting element of FIG. 1 to light of different wavebands. FIG. 2C is a relationship diagram of transmittances of a second light splitting element of FIG. 1 to light of different wavebands. FIG. 2D is a timing schematic diagram of a first laser light source, a second laser light source, a wavelength conversion module and a light valve of FIG. 2A in different time intervals. Referring to FIG. 1, a projection apparatus 200 includes an illumination system 100, a light valve 210, and a projection lens 220. The illumination system 100 is adapted to provide an illumination light beam 70. The light valve 210 is disposed on a transmission path of the illumination light beam 70, and is adapted to convert the illumination light beam 70 into an image light beam 80. The projection lens 220 is disposed on a transmission path of the image light beam 80, and is adapted to project the image light beam 80 out of the projection apparatus 200 to form an image. In the embodiment, a number of the light valve 210 is one, but the invention is not limited thereto, and in other embodiments, the number of the light valves 210 may be plural. Moreover, in the embodiment, the light valve 210 may be a digital micro-mirror device (DMD) or a liquid crystal-on-silicon panel (LCOS panel). However, in other embodiments, the light valve 210 may also be a transmissive liquid crystal panel or other light beam modulators.

To be specific, as shown in FIG. 1, in the embodiment, the illumination system 100 includes a first laser light source 110B, a second laser light source 110R, a wavelength conversion module 120, a light splitting and combining module 130, and a light uniforming element 140. Further, as shown in FIG. 2D, in the embodiment, the first laser light source 110B is turned on during a first time interval T1 and a third time interval T3 and is turned off during a second time interval T2 and a fourth time interval T4. The second laser light source 110R is turned off during the first time interval T1 and the third time interval T3 and is turned on during the second time interval T2 and the fourth time interval T4. In this way, as shown in FIG. 1 and FIG. 2D, the first laser light source 110B may provide a first laser light beam 50B during the first time interval T1 and the third time interval T3. The second laser light source 110R may provide a second laser light beam 50R during the second time interval T2 and the fourth time interval T4. For example, in the embodiment, the first laser light beam 50B is a blue laser light beam, and the second laser light beam 50R is a red laser light beam. For example, in the embodiment, the first laser light source 110B may include one or a plurality of blue laser diodes arranged in an array, and the second laser light source 110R may include one or a plurality of red laser diodes arranged in an array, but the invention is not limited thereto.

To be specific, as shown in FIG. 1, in the embodiment, the light splitting and combining module 130 includes a first light splitting element 131, light transmitting elements LT and a second light splitting element 132. The light splitting and combining module 130 is located on transmission paths of the first laser light beam 50B and the second laser light beam 50R, and the first light splitting element 131 is disposed corresponding to the first laser light source 110B and is located between the first laser light source 110B and the wavelength conversion module 120. For example, as shown in FIG. 2B, in the embodiment, the first light splitting element 131 may, for example, reflect light with a waveband within a range of 480 to 590 nm, and is pervious to light with a waveband less than 480 nm or greater than 590 nm. In other words, the first light splitting element 131 is, for example, a dichroic mirror with green reflection, which is pervious to blue and red light and provides a reflection effect to green light. Therefore, the first light splitting element 131 is pervious to the blue first laser light beam 50B. In this way, the first laser light beam 50B of the first laser light source 110B may be transmitted to the wavelength conversion module 120 by penetrating through the first light splitting element 131.

On the other hand, as shown in FIG. 1, in the embodiment, the second light splitting element 132 of the light splitting and combining module 130 is located between the second laser light source 110R and the first light splitting element 131, and the light transmitting elements LT are located between the wavelength conversion module 120 and the second light splitting element 132. For example, as shown in FIG. 2C, in the embodiment, the second light splitting element 132 may be, for example, pervious to light with a waveband within a range of 470 to 600 nm, and reflect light with a waveband less than 470 nm. In other words, the second light splitting element 132 is, for example, a dichroic mirror with blue reflection, which provides a reflection effect to blue light, and is pervious to light of other colors (for example, red light and yellow light). The light transmitting elements LT may provide a reflection effect to visible light, and in the embodiment of FIG. 1, the light transmitting elements LT are, for example, reflectors or other reflecting elements.

Further, as shown in FIG. 1 and FIG. 2A, in the embodiment, the wavelength conversion module 120 is located on the transmission path of the first laser light beam 50B and is adapted to rotate. Furthermore, as shown in FIG. 1 and FIG. 2A, the wavelength conversion module 120 includes a rotating shaft 121 and a substrate 122. The rotating shaft 121 is connected to the substrate 122, and is configured to drive the substrate 122 to rotate along the rotating shaft 121. The wavelength conversion module 120 is disposed on the transmission path of the first laser light beam 50B, and the wavelength conversion module 120 is configured with at least one non-conversion region NT and at least one wavelength conversion region WR on the substrate 122. For example, as shown in FIG. 2A, in the embodiment, an area of the at least one non-conversion region NT is the same as an area of the at least one wavelength conversion region WR, but the invention is not limited thereto. In other embodiments that are not shown, the area of the at least one non-conversion region NT and the area of the at least one wavelength conversion region WR may also be different.

To be specific, in the embodiment, the at least one non-conversion region NT of the wavelength conversion module 120 is respectively formed by a light-transmitting layer. Namely, in the embodiment, the at least one non-conversion region NT is a light penetration region, and when the at least one non-conversion region NT is located on the transmission path of the first laser light beam 50B, the first laser light beam 50B may pass through the at least one non-conversion region NT to form first color light 70B through subsequent optical elements. On the other hand, the at least one wavelength conversion region WR of the wavelength conversion module 120 is respectively formed by a wavelength conversion layer, which is configured to convert the first laser light beam 50B into a wavelength-converted light beam 60Y. For example, in the embodiment, a wavelength conversion material may include phosphor powder adapted to be excited to produce a yellow light beam. Therefore, when the at least one wavelength conversion region WR is located on the transmission path of the first laser light beam 50B, the wavelength conversion material is irradiated by the laser light beam 50B to form the wavelength-converted light beam 60Y, which is yellow light.

Further, as shown in FIG. 2A, a first standby region IB1 and a second standby region IB2 are formed between the at least one wavelength conversion region WR and the at least one non-conversion region NT. As shown in FIG. 2A, a number of the at least one wavelength conversion region WR and a number of the at least one non-conversion region NT of the wavelength conversion module 120 are respectively one. When the wavelength conversion module 120 is rotated along the rotating shaft 121, the wavelength conversion region WR, the first standby region IB1, the non-conversion region NT and the second standby region IB2 are sequentially rotated in a direction CW. For example, in the embodiment, the direction CW is a clockwise direction. Moreover, for example, in the embodiment, the first standby region IB1 or the second standby region IB2 may be a boundary region including the wavelength conversion region WR or the non-conversion region NT. To be specific, in the embodiment, as shown in FIG. 2A, the first standby region IB1 includes a first boundary B1 of one end of the wavelength conversion region WR and one end of the non-conversion region NT connected thereto. The second standby region IB2 includes a second boundary B1 of the other end of the wavelength conversion region WR and the other end of the non-conversion region NT connected thereto.

Further, as shown in FIG. 2A and FIG. 2D, in the embodiment, when the wavelength conversion module 120 is rotated along the rotating shaft 121, in the second time interval T2, a part of the non-conversion region NT adjacent to the first boundary B1, the first boundary B1, and a part of the wavelength conversion region WR adjacent to the first boundary B1 are sequentially cut into the transmission path of the first laser light beam 50B formed during a turn-on time interval of the first laser light source 110B (i.e., the first time interval T1 or the third time interval T3). In the fourth time interval T4, a part of the wavelength conversion region WR adjacent to the second boundary B2, the second boundary B2, and a part of the non-conversion region NT adjacent to the second boundary B2 are sequentially cut into the transmission path of the first laser light beam 50B formed during the turn-on time interval of the first laser light source 110B (i.e., the first time interval T1 or the third time interval T3).

To be specific, in the embodiment, the first standby region IB1 or the second standby region IB2 may be an imaginary virtual region, and a corresponding position thereof is a position where the wavelength conversion module 120 is cut into the transmission path of the first laser light beam 50B formed in the first time interval T1 and the third time interval T3 at a timing when the first laser light source 110B is turned off (i.e., the second time interval T2 and the fourth time interval T4). Namely, the illumination system 100 may control a timing when the first standby region IB1 or the second standby region IB2 of the wavelength conversion module 120 is cut into the transmission path of the first laser light beam 50B corresponding to the second time interval T2 and the fourth time interval T4. In the second time interval T2 and the fourth time interval T4, the corresponding first standby region IB1 and the second standby region IB2 are cut into the transmission path of the first laser light beam 50B. However, since the first laser light source 110B is turned off at this moment, no first laser light beam 50B passes through the first standby region IB1 or the second standby region IB2 of the wavelength conversion module 120, and no light spot is formed on the wavelength conversion module 120 by the first laser light beam 50B, and thus no phenomenon of image discoloration caused by the spoke state is generated, so that the projection apparatus 200 does not need to turn off the light valve 210 in order to reduce the phenomenon of image discoloration during the operation of the light valve 210, and therefore the brightness of the display image may be maintained.

Further, as shown in FIG. 1, FIG. 2A, and FIG. 2D, in the first time interval T1, the first laser light beam 50B forms a light spot on the wavelength conversion module 120, and the light spot is completely located on the non-conversion region NT, i.e., the first laser light beam 50B may pass through the non-conversion region NT, and is sequentially transmitted to the second light splitting element 132 and the first light splitting element 131 through the light transmitting elements LT to form the first color light 70B. On the other hand, as shown in FIG. 1 and FIG. 2D, in the second time interval T2 and the fourth time interval T4, since the second laser light source 110R is turned on, the second laser light beam 50R provided by the second laser light source 110R may pass through the second light splitting element 132 and is transmitted to the first light splitting element 131 to form second color light 70R, where the second color light 70R is, for example, red light.

Moreover, in the third time interval T3, the first laser light beam 50B forms a light spot on the wavelength conversion module 120, and the light spot is completely located on the wavelength conversion region WR. In this way, the wavelength conversion module 120 may convert the first laser light beam 50B into the wavelength-converted light beam 60Y of the yellow color through the wavelength conversion material, and transmit the wavelength-converted light beam 60Y to the first light splitting element 131, and the wavelength-converted light beam 60Y is filtered into third color light 70G with a narrow spectrum range by the first light splitting element 131, where the wavelength conversion material includes, for example, phosphor powder that may be excited to produce a yellow light beam, the wavelength-converted light beam 60Y is, for example, yellow light, and the third color light 70G is, for example, green light. Moreover, since human eyes are more sensitive to the green light, when a purity or brightness of the green light is increased, the human eyes may also perceive that the brightness of the display image becomes brighter. In this way, the illumination system 100 and the projection apparatus 200 may obtain the third color light 70G (the green light) with the narrow spectrum range (i.e., the purity is higher) by configuring the first light splitting element 131, so as to help improving the brightness of the display image perceived by human eyes.

On the other hand, as shown in FIG. 1, in the embodiment, the illumination system 100 may further selectively include an optical uniforming unit OU, and the optical uniforming unit OU is located on the transmission path of the first laser light beam 50B and the second laser light beam 50R, and is located between the first light splitting element 131 and the second light splitting element 132. For example, the optical uniforming unit OU may include a light diffusing element, a polarizing element, or a combination of the light diffusing element and the polarizing element.

Further, when the optical uniforming unit OU includes a light diffusing element, the first laser light beam 50B and the second laser light beam 50R may have a light diffusion effect after passing through the rotated optical uniforming unit OU, and the laser spot is accordingly eliminated. When the optical uniforming unit OU includes a polarizing element, the first laser light beam 50B and the second laser light beam 50R may have different polarization states at different times after passing through the rotated optical uniforming unit OU. In this way, the illumination system 100 may be applied to the projection apparatus 200 equipped with a polarization stereo mode, so as to eliminate a phenomenon of uneven image color or uneven brightness often occurred in the projection apparatus 200 equipped with the polarization stereo mode.

For example, in a known framework of the illumination system 100, polarization of a laser light beam may be destroyed by other internal optical elements, which causes disorder of a polarization direction and intensity of the laser light beam, and causes the problem of uneven brightness of the display image of the projection apparatus 200 equipped with the polarization stereo mode. However, in the illumination system 100 of the embodiment, since the illumination light beam 70 and the image light beam 80 formed by the first laser light beam 50B and the second laser light beam 50R may have different polarization states at different times, light spots of different polarization states may be formed along with different time points. Due to the effect of visual persistence, a brightness of the light spot on an illuminated surface observed by the human eye is a superimposed brightness of light spots of different time points within a visual persistence time, so that the light spots of different time points within the visual persistence time may also produce a light spot with uniform brightness after superposition, the color or brightness of the display image viewed by the user is uniform, and the user may view a stereoscopic display image with better uniformity.

Then, as shown in FIG. 1, the first color light 70B, the second color light 70R, and the third color light 70G are transmitted to the first light splitting element 131 to form an illumination light beam 70. Moreover, in the embodiment, the first color light 70B is blue light, the second color light 70R is red light, and the third color light 70G is green light. Namely, through arrangement of the first laser light source 110B, the second laser light source 110R, and the wavelength conversion module 120, the illumination system 100 may produce the illumination light beam 70 containing the RGB color light. Therefore, in the projection apparatus 200 and the illumination system 100, configuration of a filter module (a filter wheel) may be omitted, so as to reduce the loss of brightness, and achieve 100% RGB color light output ratio (CLO ratio).

Then, as shown in FIG. 1, in the embodiment, the light uniforming element 140 is located on a transmission path of the illumination light beam 70. In the embodiment, the light uniforming element 140 includes an integration rod, but the invention is not limited thereto. In more detail, as shown in FIG. 1, when the illumination light beam 70 is transmitted to the light uniforming element 140, the light uniforming element 140 uniforms the illumination light beam 70 and transmits the uniformed illumination light beam 70 to the light valve 210.

Then, as shown in FIG. 1, the light valve 210 is located on a transmission path of the illumination light beam 70 coming from the light uniforming element 140, and is configured to convert the illumination light beam 70 into the image light beam 80. The projection lens 220 is located on a transmission path of the image light beam 80, and is configured to project the image light beam 80 out of the projection apparatus 200 to form an image. After the illumination light beam 70 is converged on the light valve 210, the light valve 210 may sequentially convert the illumination light beam 70 into the image light beams 80 of different colors for transmitting to the projection lens 220. Therefore, the image formed by projecting the image light beam 80 converted by the light valve 210 may be a color image.

Furthermore, in the embodiment, the first color light 70B is blue light, the second color light 70R is red light, and the third color light 70G is green light, and since the illumination light beam 70 is formed by mixing the first color light 70B, the second color light 70R and the third color light 70G, a hue or color temperature of the illumination light beam 70 may be determined by a proportional relationship of the first color light 70B, the second color light 70R and the third color light 70G, and a hue or color temperature of the image light beam 80 formed by the illumination light beam 70 is also determined by the above proportional relationship.

To be specific, when a proportion of blue light of the illumination light beam 70 increases, the color temperature of the illumination light beam 70 also increases. For example, a ratio of a time length of the third time interval T3 to a time length of the first time interval T1 is between 2 and 4, and a ratio of a time length of the second time interval T2 or the fourth time interval T4 to the time length of the first time interval T1 is between 1 and 2.5. In this way, in the embodiment, the projection apparatus 200 and the illumination system 100 may adjust relative proportions of the first color light 70B, the second color light 70R, and the third color light 70G of the illumination light beam 70 through time lengths of turn-on time intervals of the first laser light source 110B and the second laser light source 110R and the configuration of the wavelength conversion region WR and the non-conversion region NT of the wavelength conversion module 120. Therefore, the illumination system 100 and the projection apparatus 200 may adjust the color temperature of the image light beam 80 without adjusting the intensity of the first laser light source 110B or the second laser light source 110R, thereby preventing loss of the brightness of the display image.

In this way, the illumination system 100 and the projection apparatus 200 may produce the required color light in different time intervals through arrangement of the first laser light source 110B, the second laser light source 110R, and the wavelength conversion module 120, and the phenomenon of image discoloration caused by the spoke state may be prevented, and the brightness of the display image is maintained. Moreover, in the projection apparatus 200 and the illumination system 100, arrangement of a filter module may be omitted, so as to reduce the loss of brightness, and achieve the 100% RGB color light output ratio.

Figure 3A:
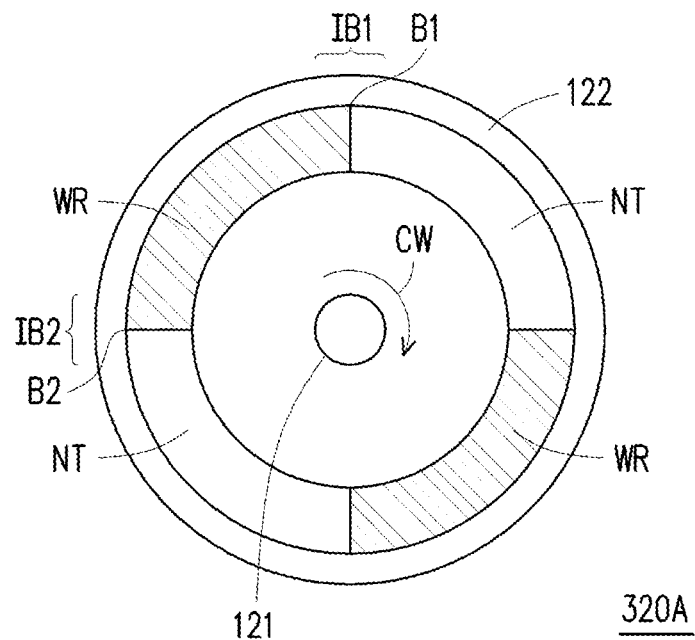
FIG. 3A and FIG. 3B are top views of different wavelength conversion modules of FIG. 1.
Figure 3B:
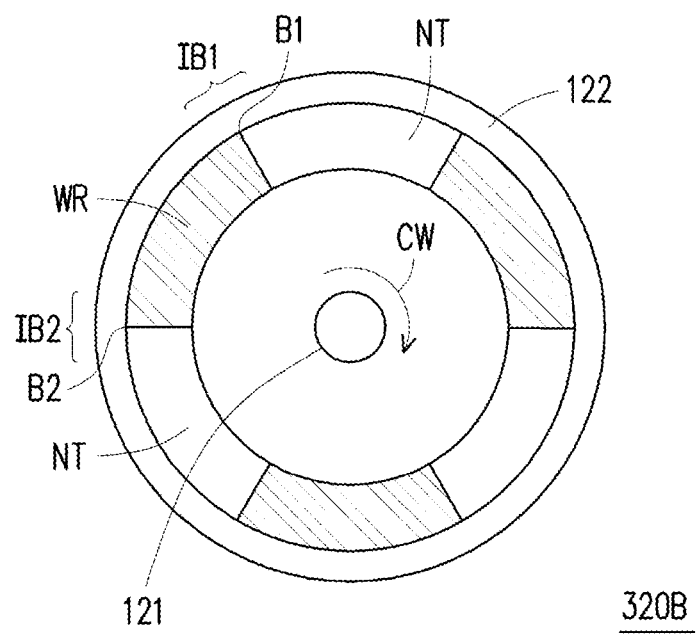

FIG. 3A and FIG. 3B are top views of different wavelength conversion modules of FIG. 1. Referring to FIG. 3A and FIG. 3B, a wavelength conversion module 320A and a wavelength conversion module 320B of FIG. 3A and FIG. 3B are similar to the wavelength conversion module 120 of FIG. 2A, and differences there between are as follows. In the embodiment of FIG. 2A, only one non-conversion region NT and one wavelength conversion region WR of the wavelength conversion module 120 are taken as an example for description, but the invention is not limited thereto. In the embodiment of FIG. 3A, the number the non-conversion regions NT and the number of the wavelength conversion regions WR in the wavelength conversion module 320A may be respectively two, and in the embodiment of FIG. 3B, the number the non-conversion regions NT and the number of the wavelength conversion regions WR in the wavelength conversion module 320B may be respectively three. In more detail, one end of a wavelength conversion region WR and one end of a non-conversion region NT connected to the above end are a first boundary B1, the first standby region IB1 includes the first boundary B1, and the other end of the wavelength conversion region WR and one end of another non-conversion region NT connected to the other end are a second boundary B2, and the second standby region IB2 includes the second boundary B2; and the other end of the other non-conversion region NT and one end of another wavelength conversion region WR connected to the other end are defined as another first boundary B1. According to the above definition, when the number of the non-conversion regions NT and the number of the wavelength conversion regions WR of the wavelength conversion module 320 are increased, the numbers of the corresponding first standby regions IB1 and the second standby regions IB2 are also increased, so that a switching frequency of the first laser light source 110B and the second laser light source 110R is also increased, i.e., a length of a switching time is accordingly reduced, which is equivalent to that a cycle time length of the light valve 210 in forming the image light beam 80 with the blue light, the red light and the green light is accordingly shortened. In this way, a color update rate of an image produced by the projection apparatus 200 using the aforementioned wavelength conversion module 320A or the wavelength conversion module 320B may also be increased accordingly to avoid the color break issue and achieve smoother viewing quality. However, due to various limitations such as a swing rate of the light valve 210, a switching response time of the first laser light source 110B and the second laser light source 110R, and the non-conversion region NT and the wavelength conversion region WR of the wavelength conversion module are required to be larger than a size of a laser light spot, in other embodiments of the invention, the number of the non-conversion regions NT and the number of the wavelength conversion regions WR in the wavelength conversion module may be respectively increased to about ten.

Moreover, in the embodiment, although the situation that the first standby region IB1 and the second standby region IB2 are formed between the non-conversion region NT and the wavelength conversion region WR is taken as an example for description, the invention is not limited thereto. In another embodiment that is not shown, when the wavelength conversion module has a plurality of wavelength conversion regions WR, and two different wavelength conversion regions WR are adjacent to each other, the first standby region IB1 or the second standby region IB2 may also be configured between the two wavelength conversion regions WR to eliminate the phenomenon of image discoloration caused by the spoke state.

In this way, when the aforementioned illumination system 100 and the projection apparatus 200 adopt the wavelength conversion module 320A of FIG. 3A or the wavelength conversion module 320B of FIG. 3B, besides similar effects and advantages as that of the aforementioned illumination system 100 and the projection apparatus 200 are achieved by achieving the configuration of the first standby region IB1 or the second standby region IB2, the number of the non-conversion regions NT and the wavelength conversion regions WR of the wavelength conversion module and the number of the corresponding first standby regions IB1 and the second standby regions IB2 may be selectively designed according to user requirements on viewing quality to meet an actual requirement on the color update rate. In this way, in the embodiments of the invention, the illumination system 100 and the projection apparatus 200 may adopt the illumination control method to simply switch the turn-on or turn-off state of the first laser light source 110B and the second laser light source 110R without limitation, so as to improve the color update rate of the projection apparatus 200 and eliminate the color break issue to achieve smoother viewing quality.

On the other hand, in the aforementioned embodiments, although the situation that the first standby region IB1 or the second standby region IB2 is the boundary region including the wavelength conversion region WR or the non-conversion region NT is taken as an example for description, the invention is not limited thereto. In other embodiments, the first standby region IB1 or the second standby region IB2 may also be a region on the substrate 122 where the wavelength conversion region WR or the non-conversion region NT is not actually arranged. By referring to the invention, any person skilled in the art may make appropriate modifications to the configuration structure of the first standby region IB1 or the second standby region IB2 to achieve the similar effects and advantages as that of the aforementioned projection apparatus 200, which is still considered to be within the scope of the invention. Some other embodiments are provided below for further description.

Figure 4A:
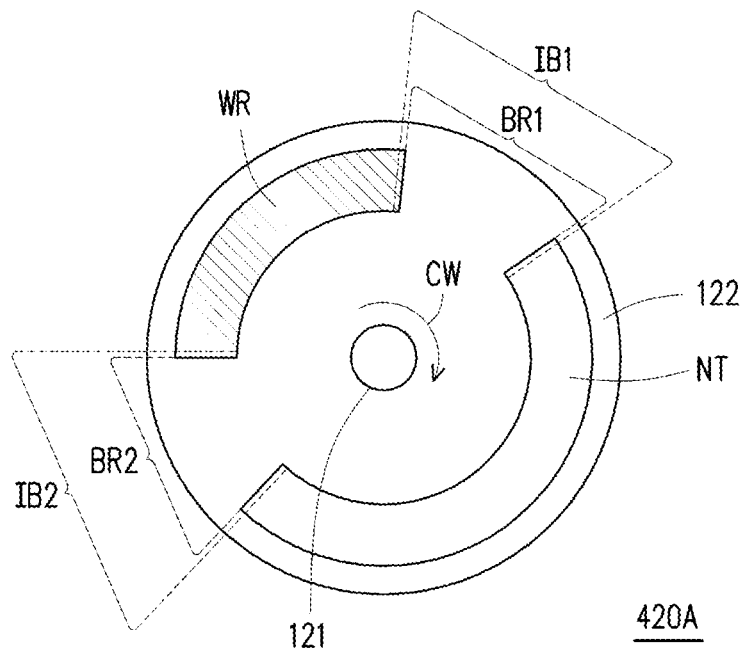
FIG. 4A to FIG. 4C are top views of different wavelength conversion modules of FIG. 1.
Figure 4B:
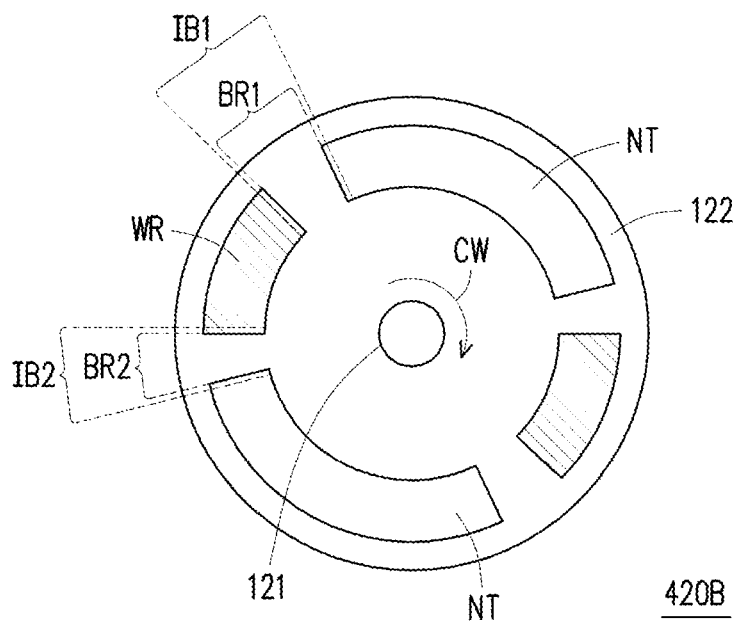
Figure 4C:
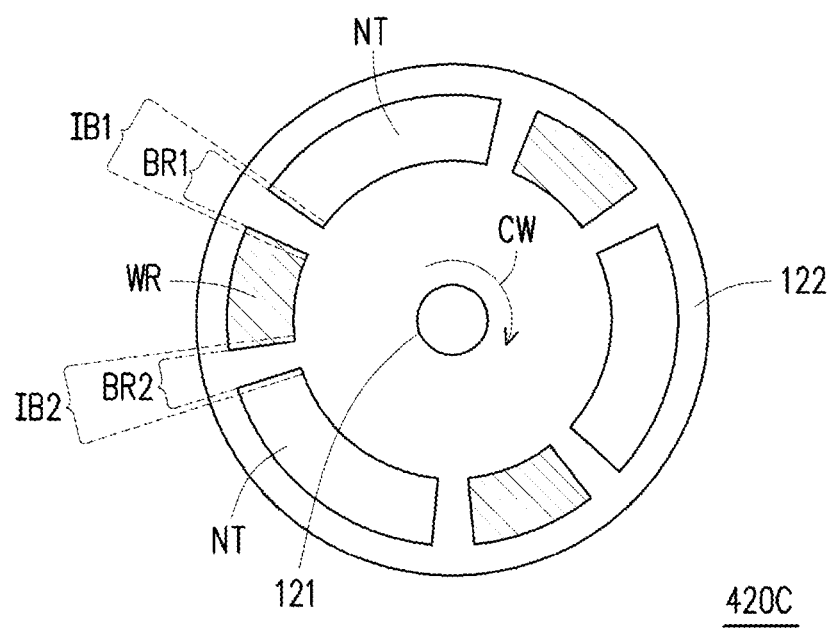

FIG. 4A to FIG. 4C are top views of different wavelength conversion modules of FIG. 1. Referring to FIG. 4A to FIG. 4C, a wavelength conversion module 420A, a wavelength conversion module 420B and a wavelength conversion module 420C of FIG. 4A to FIG. 4C are respectively similar to the wavelength conversion module 120, the wavelength conversion module 320A and the wavelength conversion module 320B of FIG. 2A, FIG. 3A and FIG. 3B, and differences there between are as follows. As shown in FIG. 4A to FIG. 4C, in the embodiment, the first standby region IB1 of the wavelength conversion module 420A, the wavelength conversion module 420B, and the wavelength conversion module 420C includes a first blank region BR1 located between one of the at least one wavelength conversion region WR and one of the at least one non-conversion region NT adjacent thereto, and the second standby region IB2 includes a second blank region BR2 located between one of the at least one wavelength conversion region WR and one of the at least one non-conversion region NT adjacent thereto. In this way, when the wavelength conversion module 420A, the wavelength conversion module 420B, or the wavelength conversion module 420C is rotated, in the second time interval T2, a part of the at least one non-conversion region NT adjacent to the first blank region BR1, the first blank region BR1, and a part of the at least one wavelength conversion region WR adjacent to the first blank region BR1 are sequentially cut into the transmission path of the first laser light beam 50B formed during the turn-on time interval of the first laser light source 110B (i.e. the first time interval T1 or the third time interval T3). In the fourth time interval T4, a part of the at least one wavelength conversion region WR adjacent to the second blank region BR2, the second blank region BR2, and a part of the at least one non-conversion region NT adjacent to the second blank region BR2 are sequentially cut into the transmission path of the first laser light beam 50B formed during the turn-on time interval of the first laser light source 110B (i.e. the first time interval T1 or the third time interval T3).

In this way, since the first laser light source 110B is turned off during the second time interval T2 and the fourth time interval T4, no first laser light beam 50B passes through the first standby region IB1 or the second standby region IB2 of the wavelength conversion module 420A, the wavelength conversion module 420B, or the wavelength conversion module 420C, and no light spot is formed on the wavelength conversion module 420A, the wavelength conversion module 420B, or the wavelength conversion module 420C by the first laser light beam 50B, and therefore the phenomenon of image discoloration caused by the spoke state is not produced. Therefore, when the aforementioned illumination system 100 and projection apparatus 200 adopt any of the wavelength conversion module 420A, the wavelength conversion module 420B, or the wavelength conversion module 420C of FIG. 4A to FIG. 4C, the projection apparatus 200 does not need to turn off the light valve 210 in order to reduce the phenomenon of image discoloration during the operation of the light valve 210, and therefore the brightness of the display image may be maintained.

In this way, in the embodiment, when any of the wavelength conversion module 420A, the wavelength conversion module 420B, or the wavelength conversion module 420C of FIG. 4A to FIG. 4C is adopted, the illumination system 100 may also have the advantages of the aforementioned illumination system 100 and projection device 200 through configuration of the wavelength conversion module 420A, the wavelength conversion module 420B, or the wavelength conversion module 420C, which is not repeated.

On the other hand, in the aforementioned embodiments, although the non-conversion region NT implemented by the light penetration region is taken as an example for description, the invention is not limited thereto. In other embodiments, the non-conversion region NT may also be a light reflection region. By referring to the invention, any person skilled in the art may make appropriate modifications to the design of the light paths of the illumination system 100 to achieve the similar effects and advantages as that of the aforementioned projection apparatus 200, which is still considered to be within the scope of the invention. Some other embodiments are provided below for further description.

Figure 5A:
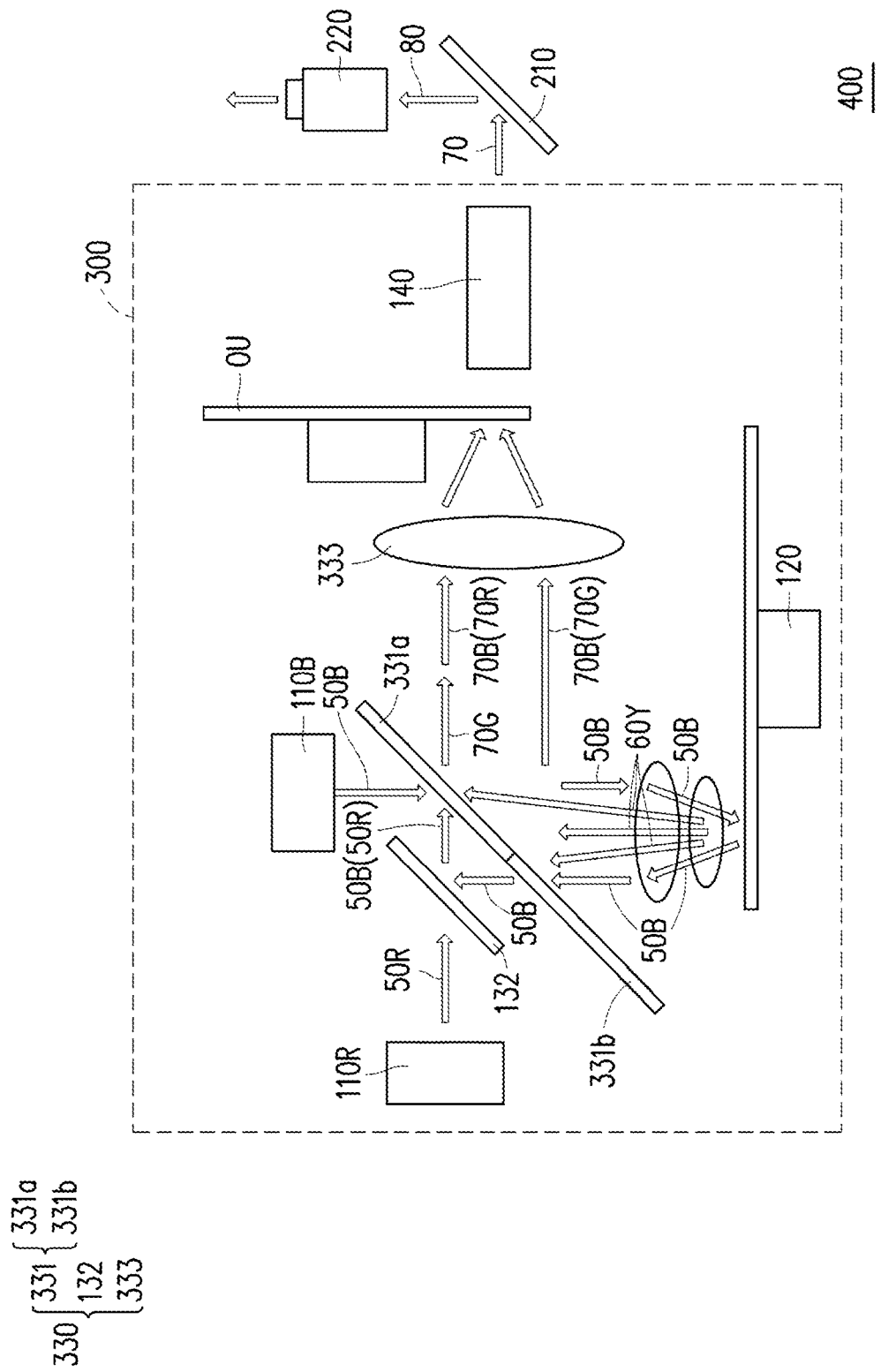
FIG. 5A is a structural schematic diagram of another projection apparatus according to an embodiment of the invention.
Figure 5B:
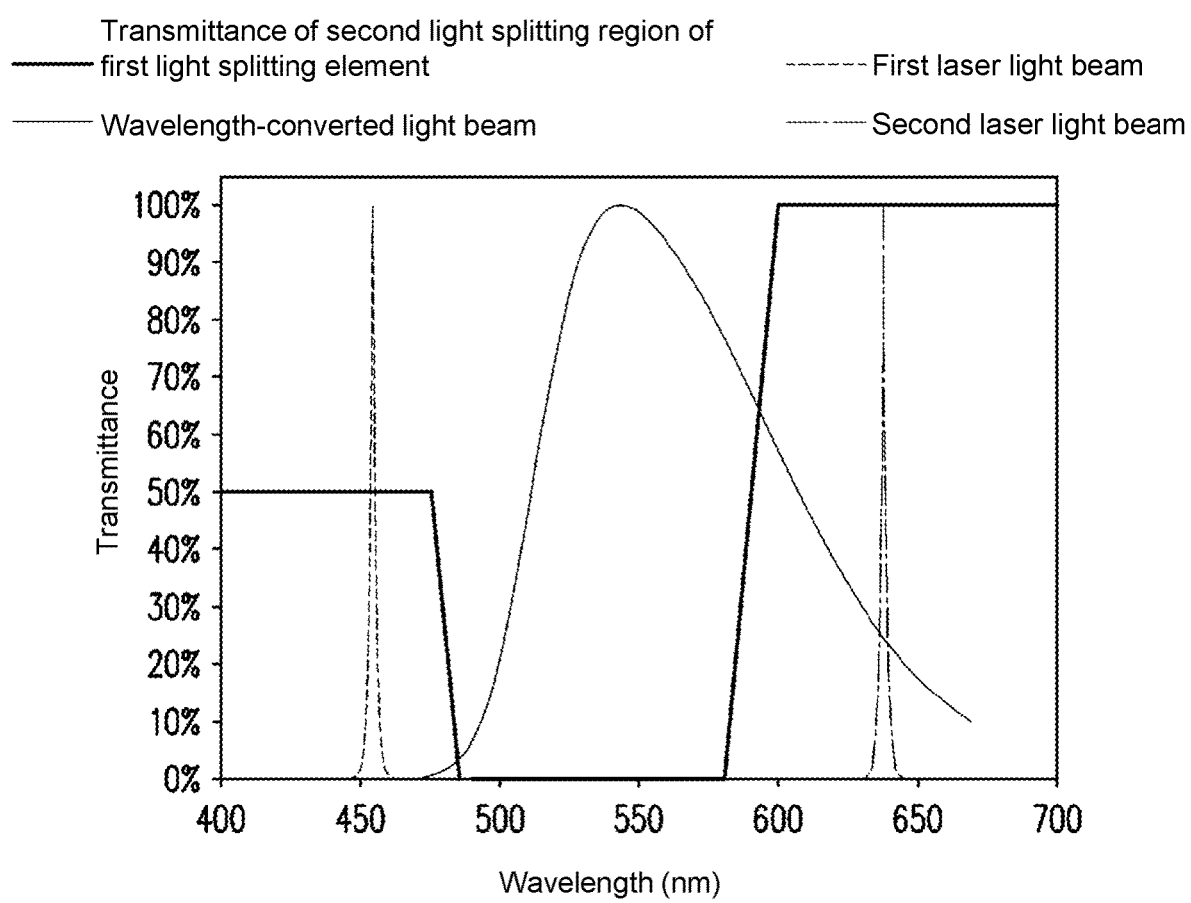
FIG. 5B is a relationship diagram of transmittances of a second light splitting region of a first light splitting element of FIG. 1 to light of different wavebands.

FIG. 5A is a structural schematic diagram of another projection apparatus according to an embodiment of the invention. FIG. 5B is a relationship diagram of transmittances of a second light splitting region of a first light splitting element of FIG. 1 to light of different wavebands. An illumination system 300 and a projection apparatus 400 of FIG. 5A are similar to the illumination system 100 and the projection apparatus 200 of FIG. 1, and differences there between are as follows. Referring to FIG. 5A, the at least one non-conversion region NT of the wavelength conversion module 120 of the illumination system 300 is respectively formed by a reflective layer. Namely, in the embodiment, the at least one non-conversion region NT is a light reflection region, and is adapted to reflect the first laser light beam 50B to form the first color light 70B through the subsequent optical elements. To be specific, in the embodiment, a first light splitting element 331 of a light splitting and combining module 330 has a first light splitting region 331a and a second light splitting region 331b, and the light splitting and combining module 330 further includes a light converging lens 333. In detail, in the embodiment, the first light splitting region 331a of the first light splitting element 331 is disposed corresponding to the first laser light source 110B, and is located between the first laser light source 110B and the wavelength conversion module 120, and the second light splitting region 331b of the first light splitting element 331 is located on the transmission path of the first laser light beam 50B reflected by the non-conversion region NT of the wavelength conversion module 120, and the second light splitting region 331b is located between the wavelength conversion module 120 and the second light splitting element 132.

Further, in the embodiment, the first light splitting region 331a of the first light splitting element 331 is, for example, a dichroic mirror with green reflection, and a relationship curve of transmittances of the first light splitting region 331a of the first light splitting element 331 to light of different wavebands is the same as the relationship curve of the transmittances of the first light splitting element 331 to light of different wavebands shown in FIG. 2B, which is not repeated. Therefore, the first light splitting region 331a of the first light splitting element 331 is pervious to blue light, and provides a reflection effect to green light. In this way, the first laser light beam 50B of the first laser light source 110B may still be transmitted to the wavelength conversion module 120 by penetrating through the first light splitting region 331a of the first light splitting element 331.

On the other hand, in the embodiment, the second light splitting region 331b of the first light splitting element 331 is a dichroic mirror with green reflection and blue transflection. For example, as shown in FIG. 5B, the second light splitting region 331b of the first light splitting element 331 may, for example, reflect light with a waveband within a range of 480 to 590 nm, and has a transmittance of 50% and a reflectance of 50% to light with a waveband below 480 nm, and is pervious to light with a waveband greater than 590 nm. In this way, as shown in FIG. 5A, when the first laser light beam 50B is reflected to the second light splitting region 331b by the non-conversion region NT of the wavelength conversion module 120, a part of the first laser light beam 50B is reflected to one side of the light converging lens 333 by the second light splitting region 331b of the first light splitting element 331, while the other part of the first laser light beam 50B passes through the second light splitting region 331b of the first light splitting element 331 and is transmitted to the second light splitting element 132, and is then reflected to another side of the light converging lens 333 by the second light splitting element 132. Moreover, the first laser light beam 50B incident to the different sides of the light converging lens 333 may be combined by the light converging lens 333 to form the first color light 70B.

On the other hand, the illumination system 300 may still respectively form the third color light 70G and the second color light 70R through the configuration of the wavelength conversion region WR of the wavelength conversion module 120 and the second laser light source 110R. In the embodiment, light paths of the third color light 70G and the second color light 70R are the same as the light paths of the third color light 70G and the second color light 70R of the embodiment of FIG. 1, and details thereof may be obtained by referring to the above paragraphs, which are not repeated.

In this way, the illumination system 300 and the projection apparatus 400 may produce the required color light in different time intervals through arrangement of the first laser light source 110B, the second laser light source 110R, and the wavelength conversion module 120, and the phenomenon of image discoloration caused by the spoke state may be prevented, and the brightness of the display image is maintained. As such, the similar effects and advantages as that of the aforementioned illumination system 100 and the projection apparatus 200 are achieved, which are not repeated.

Moreover, as shown in FIG. 5A, in the embodiment, the illumination system 300 may also selectively include an optical uniforming unit OU, and the optical uniforming unit OU is located between the first light splitting element 331 and the light uniforming element 140. In this way, in the illumination system 300, the uniformity of the display image may be improved through arrangement of the optical uniforming unit OU.

Figure 6A:
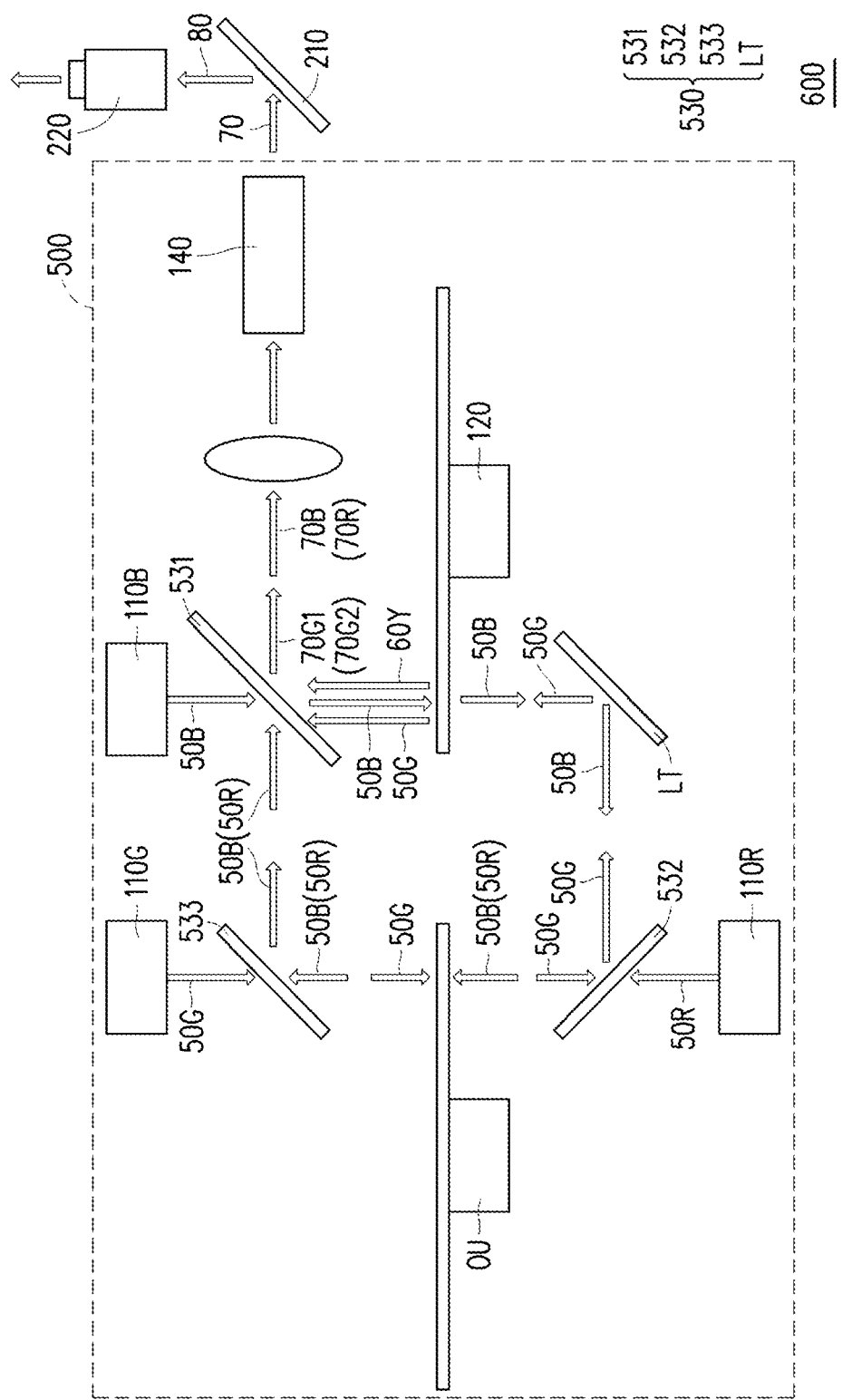
FIG. 6A is a structural schematic diagram of another projection apparatus according to an embodiment of the invention.
Figure 6B:
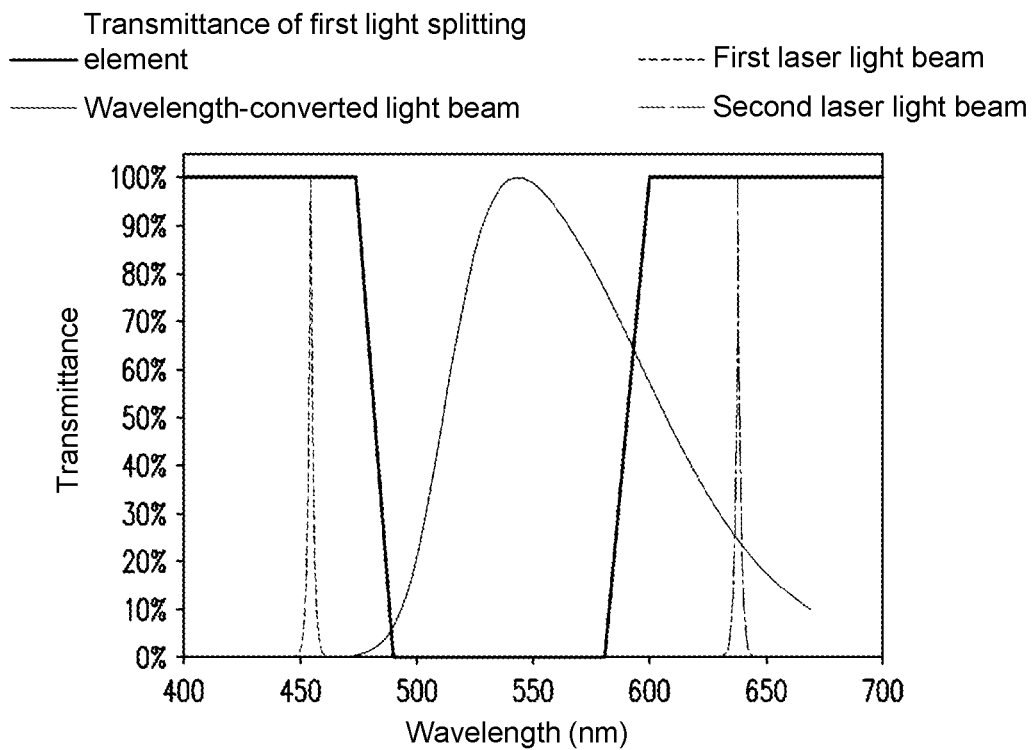
FIG. 6B is a relationship diagram of transmittances of a first light splitting element of FIG. 6A to light of different wavebands.
Figure 6C:
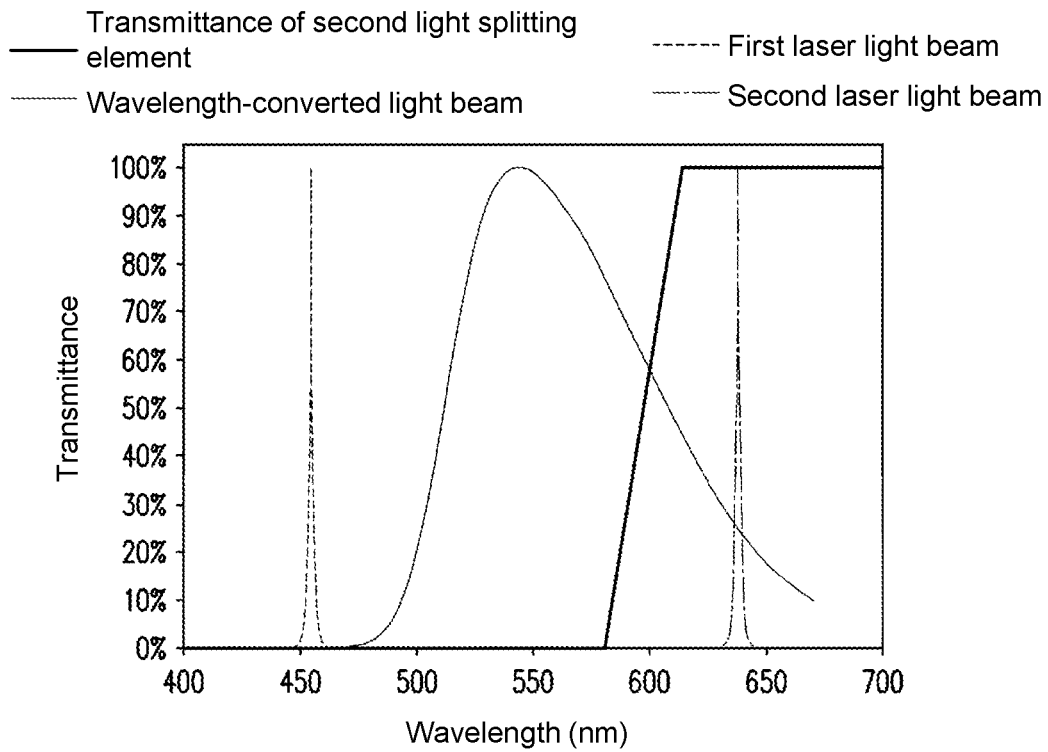
FIG. 6C is a relationship diagram of transmittances of a second light splitting element of FIG. 6A to light of different wavebands.
Figure 6D:
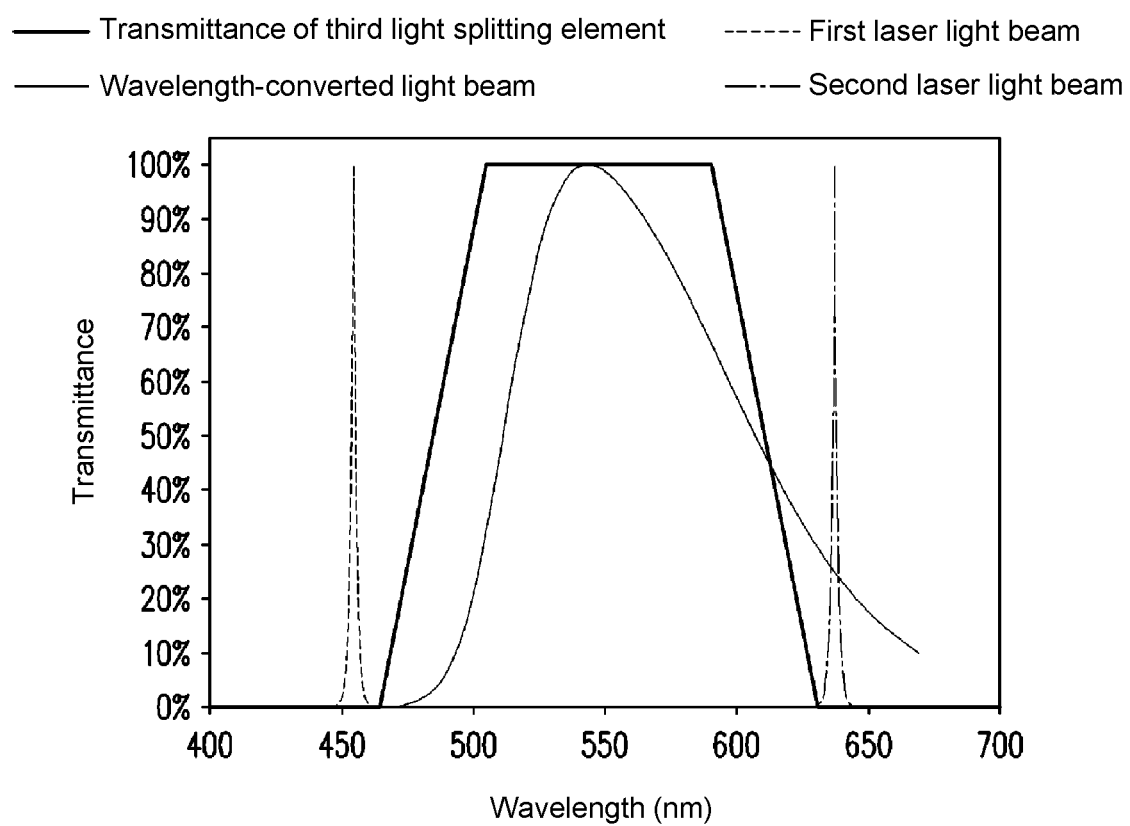
FIG. 6D is a relationship diagram of transmittances of a third light splitting element of FIG. 6A to light of different wavebands.
Figure 6E:
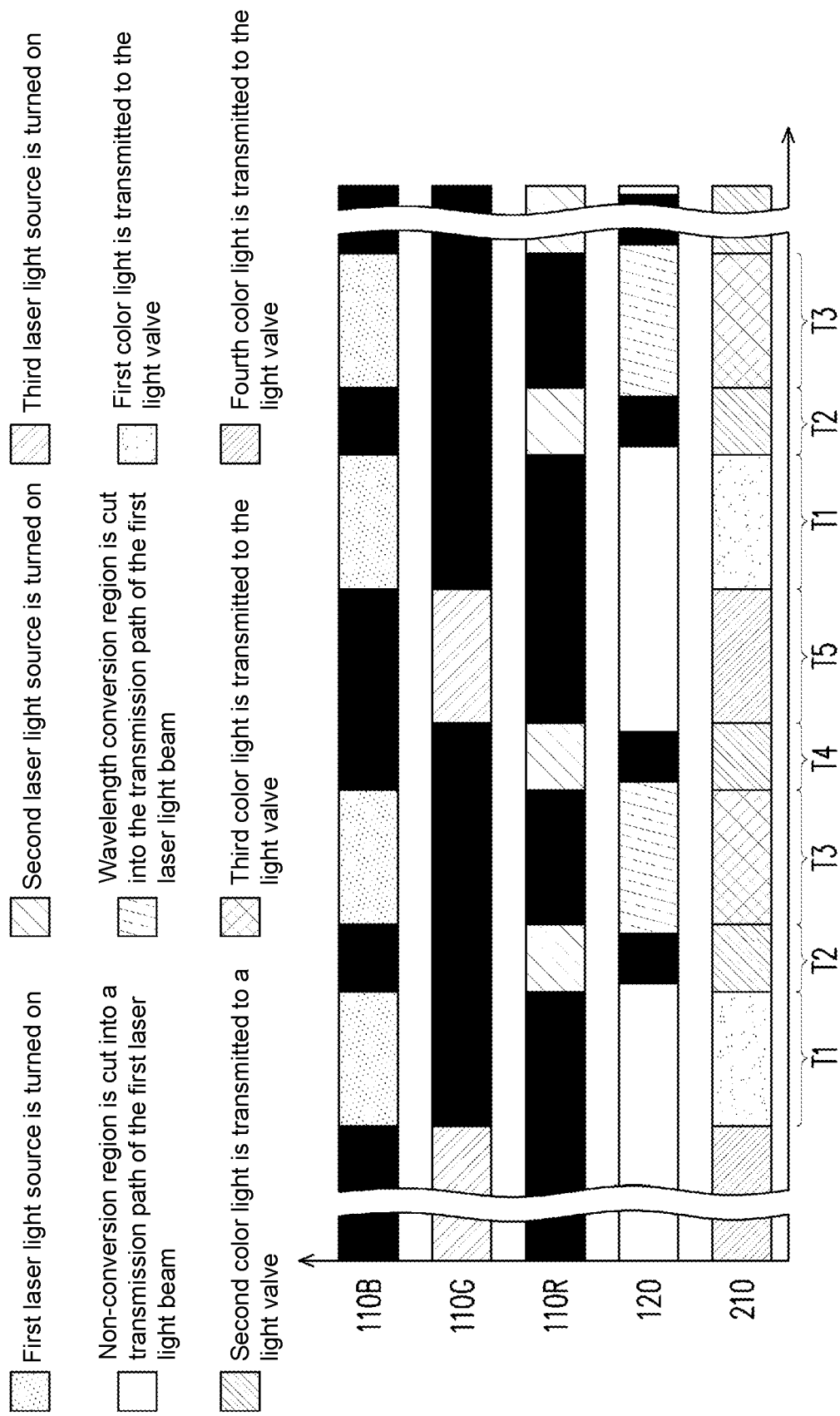
FIG. 6E is a timing schematic diagram of a first laser light source, a second laser light source, a third laser light source, a wavelength conversion module and a light valve of FIG. 6A in different time intervals.

FIG. 6A is a structural schematic diagram of another projection apparatus according to an embodiment of the invention. FIG. 6B is a relationship diagram of transmittances of a first light splitting element of FIG. 6A to light of different wavebands. FIG. 6C is a relationship diagram of transmittances of a second light splitting element of FIG. 6A to light of different wavebands. FIG. 6D is a relationship diagram of transmittances of a third light splitting element of FIG. 6A to light of different wavebands. FIG. 6E is a timing schematic diagram of a first laser light source, a second laser light source, a third laser light source, a wavelength conversion module and a light valve of FIG. 6A in different time intervals. Referring to FIG. 6A, an illumination system 500 and a projection apparatus 600 of the embodiment of FIG. 6A are similar to the illumination system 100 and the projection apparatus 200 of FIG. 1, and differences therebetween are as follows. As shown in FIG. 6A and FIG. 6E, in the embodiment, the illumination system 500 further includes a third laser light source 110G. To be specific, the third laser light source 110G is configured to provide a third laser light beam 50G in a fifth time interval T5. For example, in the embodiment, the third laser light beam 50G is a green laser light beam. For example, in the embodiment, the third laser light source 110G may be one or a plurality of green laser diodes arranged in an array, but the invention is not limited thereto.

In detail, as shown in FIG. 6E, in the embodiment, the first laser light source 110B is turned on during the first time interval T1 and the third time interval T3 and is turned off during the second time interval T2, the fourth time interval T4, and the fifth time interval T5. The second laser light source 110R is turned on during the second time interval T2 and the fourth time interval T4 and is turned off during the first time interval T1, the third time interval T3, and the fifth time interval T5. The third laser light source 110G is turned on during the fifth time interval T5 and is turned off during the first time interval T1, the second time interval T2, the third time interval T3, and the fourth time interval T4. In other words, as shown in FIG. 6E, in the first time interval T1 and the third time interval T3, only the first laser light beam 50B is provided, in the second time interval T2 and the fourth time interval T4, only the second laser light beam 50R is provided, and in the fifth time interval T5, only the third laser light beam 50G is provided.

On the other hand, in the embodiment, a light splitting and combining module 530 further includes a third light splitting element 533, and the third light splitting element 533 is located between the second light splitting element 532 and the first light splitting element 531, and is also located between the second light splitting element 532 and the third laser light source 110G. Moreover, to be specific, in the embodiment, the first light splitting element 531 is, for example, a dichroic mirror with green-orange reflection, which is pervious to red and blue light, and provides a reflection effect to green-orange light. For example, as shown in FIG. 6B, in the embodiment, the first light splitting element 531 may, for example, reflect light with a waveband within a range of 480 to 590 nm, and is pervious to light with a waveband less than 480 nm or greater than 590 nm. The second light splitting element 532 is, for example, a dichroic mirror with cyan (i.e., a combination of blue and green) reflection, which is pervious to red light, and provides a reflection effect to blue light and green light. For example, as shown in FIG. 6C, in the embodiment, the second light splitting element 532 may reflect light with a waveband less than 600 nm, and is pervious to light with a waveband greater than 600 nm. The third light splitting element 533 is, for example, a dichroic mirror with blue and red reflection, which is pervious to green light, and provides a reflection effect to blue light and red light. As shown in FIG. 6D, in the embodiment, the third light splitting element 533 may, for example, reflect light with a waveband less than 470 nm or greater than 630, and is pervious to light with a waveband within a range of 470 nm to 630 nm.

Moreover, in the embodiment, the optical uniforming unit OU is located on transmission paths of the first laser light beam 50B, the second laser light beam 50R and the third laser light beam 50G, and the wavelength conversion module 120 is also disposed on the transmission path of the third laser light beam 50G.

In this way, as shown in FIG. 6A and FIG. 6E, in the first time interval T1, the non-conversion region NT of the wavelength conversion module 120 is cut into the transmission path of the first laser light beam 50B, and the first laser light beam 50B may penetrate through the non-conversion region NT of the wavelength conversion module 120, and is sequentially transmitted to the second light splitting element 532 and the third light splitting element 533 through the light transmitting element LT, and is reflected to the first light splitting element 531 to form the first color light 70B. In the third time interval T3, the wavelength conversion region WR of the wavelength conversion module 120 is cut into the transmission path of the first laser light beam 50B, and the first laser light beam 50B may be converted into the wavelength-converted light beam 60Y of the yellow color by the wavelength conversion region WR of the wavelength conversion module 120, and then the wavelength-converted light beam 60Y is transmitted to the first light splitting element 531, and is filtered by the first light splitting element 531 to form third color light 70G1 with a narrow spectrum range.

On the other hand, as shown in FIG. 6A and FIG. 6E, in the second time interval T2 and the fourth time interval T4, since the second laser light source 110R is turned on, the second laser light beam 50R provided by the second laser light source 110R may penetrate through the second light splitting element 532, and is reflected to the first light splitting element 531 by the third light splitting element 533 to form the second color light 70R. In the fifth time interval 15, since the third laser light source 110G is turned on, the third laser light beam 50G provided by the third laser light source 110G may penetrate through the third light splitting element 533, and is reflected to the wavelength conversion module 120 by the second light splitting element 532 and the light transmitting element LT, and then the third laser light beam 50G penetrates through the non-conversion region NT of the wavelength conversion module 120 and is transmitted to the first light splitting element 531 to form a fourth color light 70G2.

Moreover, in the embodiment, the projection apparatus 600 and the illumination system 500 may adjust relative proportions of the first color light 70B, the second color light 70R, the third color light 70G1 and the fourth color light 70G2 of the illumination light beam 70 through time lengths of turn-on time intervals of the first laser light source 110B, the second laser light source 110R and the third laser light source 110G and the configuration of the wavelength conversion region WR and the non-conversion region NT of the wavelength conversion module 120. For example, in the embodiment, a ratio of a time length of the third time interval T3 to a time length of the first time interval T1 is between 0.5 and 1.5, a ratio of a time length of the second time interval T2 or the fourth time interval T4 to the time length of the first time interval T1 is between 0.5 and 1.5, and a ratio of a time length of the fifth time interval 15 to the time length of the first time interval T1 is between 1.5 and 3. In this way, in the illumination system 500 and the projection device 600, a color temperature of the image light beam 80 may be adjusted without adjusting the intensity of the first laser light source 110B or the second laser light source 110R, thereby avoiding loss of the brightness of the display image.

Moreover, in the embodiment, since the fourth color light 70G2 in the illumination light beam 70 is green light with the narrow spectrum range, and the human eye is more sensitive to green light, when the purity or brightness of the green light is increased, the human eye may also feel a brighter brightness of the display image. In this way, through the configuration of the third laser light source 110G and the first light splitting element 531 in the illumination system 500 and the projection apparatus 600, the brightness of the display image perceived by human eyes is increased.

On the other hand, in the embodiment, the illumination system 500 and the projection apparatus 600 are capable of producing the required color light at different time intervals through arrangement of the first laser light source 110B, the second laser light source 110R, and the wavelength conversion module 120, so that the phenomenon of image discoloration caused by the spoke state is prevented, and the brightness of the display image is maintained. Accordingly, the similar effects and advantages as that of the aforementioned illumination system 100 and projection apparatus 200 are achieved, which are not repeated.

Figure 7A:
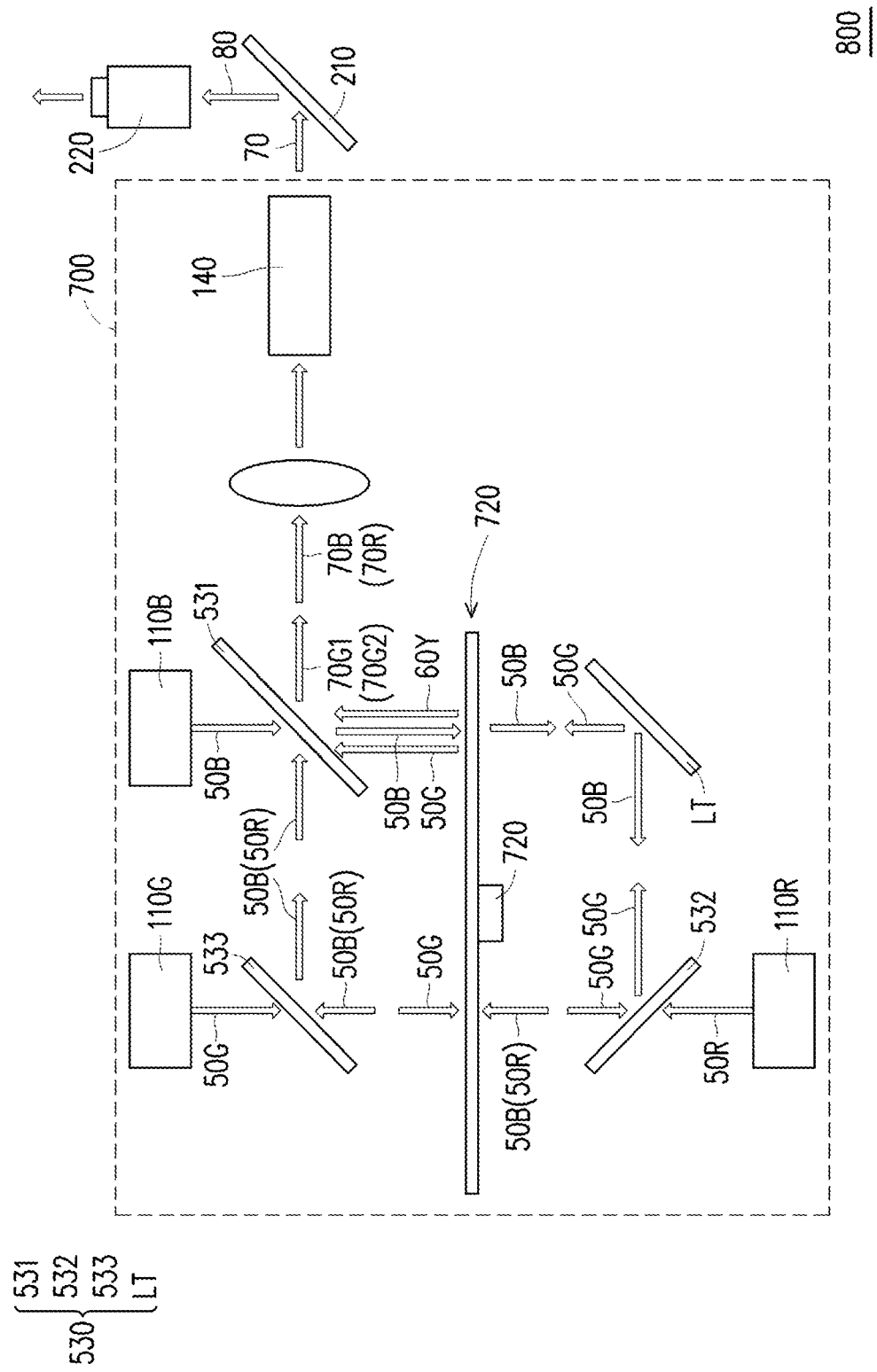
FIG. 7A is a structural schematic diagram of another projection apparatus according to an embodiment of the invention.
Figure 7B:
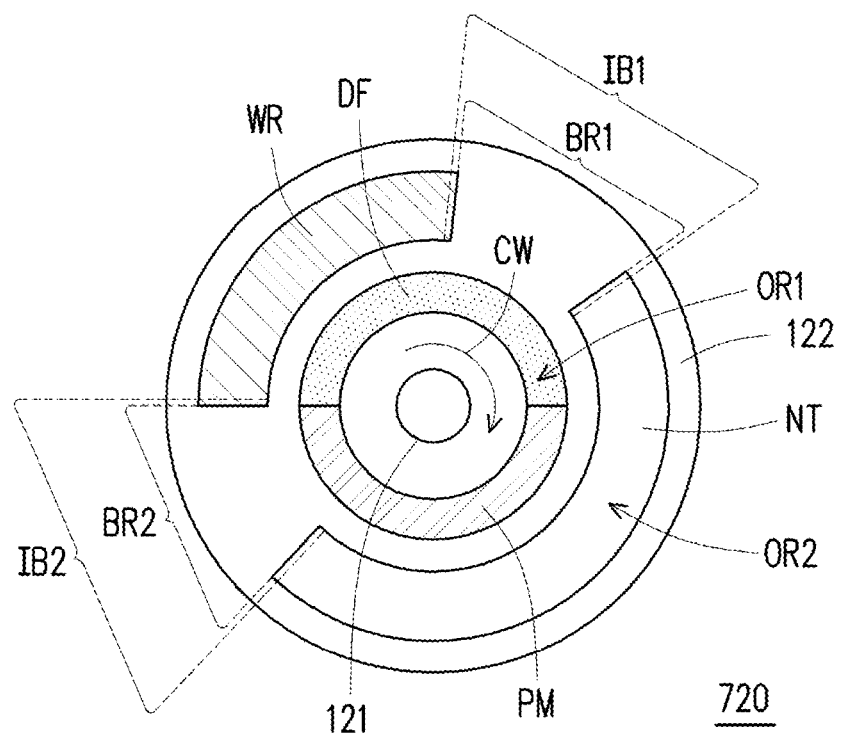
FIG. 7B is a top view of a wavelength conversion module of FIG. 7A.

FIG. 7A is a structural schematic diagram of another projection apparatus according to an embodiment of the invention. FIG. 7B is a top view of another wavelength conversion module of FIG. 7A. Referring to FIG. 7A, an illumination system 700 and a projection apparatus 800 of the embodiment of FIG. 7A are similar to the illumination system 500 and the projection apparatus 600 of FIG. 6, and differences there between are as follows. In the embodiment of FIG. 6A, the wavelength conversion module 120 and the optical uniforming unit OU are respectively an independent single element. In the embodiment, as shown in FIG. 7A and FIG. 7B, the optical uniforming unit OU may be configured on a wavelength conversion module 720 to become a part of the wavelength conversion module 720. To be specific, in the embodiment, the wavelength conversion module 720 includes a first annular region OR1 and a second annular region OR2 arranged in different radial ranges, where the two annular regions are, for example, concentric annular regions. For example, in the embodiment, an inner diameter of the second annular region OR2 is greater than an inner diameter of the first annular region OR1, but the invention is not limited thereto. In other embodiments, the inner diameter of the second annular region OR2 may be smaller than the inner diameter of the first annular region OR1.

To be more specific, as shown in FIG. 7B, a light diffusing element DF or/and a polarizing element PM of the optical uniforming unit OU is/are disposed on the first annular region OR1, and at least one wavelength conversion region WR and at least one non-conversion region NT of the wavelength conversion module 720 are disposed on the second annular region OR2. In this way, the first laser light beam 50B may sequentially pass through the at least one non-conversion region NT located on the second annular region OR2 and the optical uniforming unit OU located on the first annular region OR1 to form the first color light 70B. The second laser light beam 50R may pass through the optical uniforming unit OU located on the first annular region OR1 to form the second color light 70R. The third laser light beam 50G may sequentially pass through the optical uniforming unit OU located on the first annular region OR1 and the at least one non-conversion region NT located on the second annular region OR2 to form the fourth color light 70G2.

In this way, the illumination system 700 and the projection apparatus 800 are also capable of producing the required color light at different time intervals through arrangement of the first laser light source 110B, the second laser light source 110R, the third laser light source 110G, and the wavelength conversion module 720, so that the phenomenon of image discoloration caused by the spoke state is prevented, and the brightness of the display image is maintained. Accordingly, the similar effects and advantages as that of the aforementioned illumination system 500 and projection apparatus 600 are achieved, which are not repeated.

In summary, the embodiments of the invention have at least one of following advantages or effects. In the embodiments of the invention, the illumination system and the projection apparatus are capable of producing the required color light at different time intervals through arrangement of the first laser light source, the second laser light source, and the wavelength conversion module, so that the phenomenon of image discoloration caused by the spoke state is prevented, and the brightness of the display image is maintained. Moreover, arrangement of a filter module in the projection apparatus and the illumination system may be omitted, so that the loss of brightness is reduced, and a 100% RGB color light output ratio (CLO) is achieved. Moreover, in the embodiments of the invention, the illumination system and the projection apparatus may adopt the illumination control method to simply switch the turn-on or turn-off state of the first laser light source and the second laser light source without limitation, so as to improve the color update rate of the projection apparatus and eliminate the color break issue to achieve smooth viewing quality.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An illumination system, configured to provide an illumination light beam, the illumination system comprising a first laser light source, a second laser light source, and a wavelength conversion module, wherein:

the first laser light source provides a first laser light beam in a first time interval and a third time interval;

the second laser light source provides a second laser light beam in a second time interval and a fourth time interval; and the wavelength conversion module is located on a transmission path of the first laser light beam, wherein the wavelength conversion module has at least one wavelength conversion region and at least one non-conversion region, a first standby region and a second standby region are formed between the at least one wavelength conversion region and the at least one non-conversion region, and the wavelength conversion module is configured to rotate along a rotating shaft, so that the at least one wavelength conversion region, the first standby region, the at least one non-conversion region, and the second standby region are sequentially rotated in one direction, and the at least one wavelength conversion region and the at least one non-conversion region are alternately cut into the transmission path of the first laser light beam, wherein, when the wavelength conversion module is rotated, in the first time interval, the first laser light beam is incident to the at least one non-conversion region of the wavelength conversion module to form a first color light, in the second time interval and the fourth time interval, the second laser light beam forms a second color light, and in the third time interval, the first laser light beam is incident to the wavelength conversion region of the wavelength conversion module to form a third color light, and in the second time interval and the fourth time interval, the first standby region and the second standby region are respectively cut into the transmission path of the first laser light beam formed in the first time interval or the third time interval, and no light spot is formed on the wavelength conversion module by the first laser light beam.

2. The illumination system as claimed in claim 1, wherein the first laser light source is turned on in the first time interval and the third time interval and is turned off in the second time interval and the fourth time interval, and the second laser light source is turned off in the first time interval and the third time interval and is turned on in the second time interval and the fourth time interval.

3. The illumination system as claimed in claim 1, wherein the first standby region comprises a first boundary of one of the at least one wavelength conversion region and one of the at least one non-conversion region adjacent thereto, and in the second time interval, a part of the at least one non-conversion region adjacent to the first boundary, the first boundary, and a part of the at least one wavelength conversion region adjacent to the first boundary are sequentially cut into the transmission path of the first laser light beam formed in the first time interval or the third time interval; and the second standby region comprises a second boundary of one of the at least one wavelength conversion region and one of the at least one non-conversion region adjacent thereto, and in the fourth time interval, a part of the at least one wavelength conversion region adjacent to the second boundary, the second boundary, and a part of the at least one non-conversion region adjacent to the second boundary are sequentially cut into the transmission path of the first laser light beam formed in the first time interval or the third time interval.

4. The illumination system as claimed in claim 1, wherein the first standby region comprises a first blank region located between one of the at least one wavelength conversion region and one of the at least one non-conversion region adjacent thereto, and in the second time interval, a part of the at least one non-conversion region adjacent to the first blank region, the first blank region, and a part of the at least one wavelength conversion region adjacent to the first blank region are sequentially cut into the transmission path of the first laser light beam formed in the first time interval or the third time interval; and the second standby region comprises a second blank region located between one of the at least one wavelength conversion region and one of the at least one non-conversion region adjacent thereto, and in the fourth time interval, a part of the at least one wavelength conversion region adjacent to the second blank region, the second blank region, and a part of the at least one non-conversion region adjacent to the second blank region are sequentially cut into the transmission path of the first laser light beam formed in the first time interval or the third time interval.

5. The illumination system as claimed in claim 1, wherein the at least one non-conversion region is a light penetration region.

6. The illumination system as claimed in claim 5, further comprising:

a third laser light source, configured to provide a third laser light beam in a fifth time interval, wherein the first laser light source is turned on in the first time interval and the third time interval and is turned off in the second time interval, the fourth time interval, and the fifth time interval, the second laser light source is turned on in the second time interval and the fourth time interval and is turned off in the first time interval, the third time interval, and the fifth time interval, and the third laser light source is turned in the fifth time interval and is turned off in the first time interval, the second time interval, the third time interval, and the fourth time interval.

7. The illumination system as claimed in claim 6, further comprising:

an optical uniforming unit, located on transmission paths of the first laser light beam, the second laser light beam, and the third laser light beam, and the wavelength conversion module is disposed on the transmission path of the third laser light beam.

8. The illumination system as claimed in claim 7, wherein the wavelength conversion module comprises a first annular region and a second annular region arranged in different radial ranges, the optical uniforming unit is disposed on the first annular region, the at least one wavelength conversion region and the at least one non-conversion region of the wavelength conversion module are disposed on the second annular region, the first laser light beam forms the first color light after sequentially passing through the at least one non-conversion region located on the second annular region and the optical uniforming unit located on the first annular region, the second laser light beam forms the second color light after passing through the optical uniforming unit located on the first annular region, and the third laser light beam forms a fourth color light after sequentially passing through the optical uniforming unit located on the first annular region and the at least one non-conversion region located on the second annular region.

9. The illumination system as claimed in claim 7, wherein a ratio of a time length of the third time interval to a time length of the first time interval is between 0.5 and 1.5, a ratio of a time length of the second time interval or the fourth time interval to the time length of the first time interval is between 0.5 and 1.5, and a ratio of a time length of the fifth time interval to the time length of the first time interval is between 1.5 and 3.

10. The illumination system as claimed in claim 1, wherein the at least one non-conversion region is a light reflection region.

11. The illumination system as claimed in claim 1, wherein a ratio of a time length of the third time interval to a time length of the first time interval is between 2 and 4, and a ratio of a time length of the second time interval or the fourth time interval to the time length of the first time interval is between 1 and 2.5.

12. A projection apparatus, comprising an illumination system, a light valve, and a projection lens, wherein the illumination system is the illumination system as claimed in claim 1;

the light valve is located on a transmission path of the illumination light beam and is configured to convert the illumination light beam into an image light beam, and the projection lens is located on a transmission path of the image light beam and is configured to project the image light beam out of the projection apparatus.

13. An illumination control method, configured to control an illumination system in a projection apparatus, the illumination system comprising a first laser light source, a second laser light source, and a wavelength conversion module, wherein the first laser light source is configured to provide a first laser light beam, the second laser light source is configured to provide a second laser light beam, the wavelength conversion module is located on a transmission path of the first laser light beam and has at least one wavelength conversion region and at least one non-conversion region, a first standby region and a second standby region are formed between the at least one wavelength conversion region and the at least one non-conversion region, the wavelength conversion module is configured to rotate along a rotating shaft, so that the at least one wavelength conversion region, the first standby region, the at least one non-conversion region, and the second standby region are sequentially rotated in one direction, and the at least one wavelength conversion region and the at least one non-conversion region are alternately cut into the transmission path of the first laser light beam, and the illumination control method comprises:

in a first time interval, turning on the first laser light source and turning off the second laser light source, wherein the first laser light beam is incident to the at least one non-conversion region of the wavelength conversion module to form a first color light;

in a second time interval, turning on the second laser light source and turning off the first laser light source, wherein the second laser light beam forms a second color light, the first standby region is cut into the transmission path of the first laser light beam formed in the first time interval or a third time interval, and no light spot is formed on the wavelength conversion module by the first laser light beam;

in the third time interval, turning on the first laser light source and turning off the second laser light source, wherein the first laser light beam forms a third color light after being incident to the at least one wavelength conversion region of the wavelength conversion module; and in a fourth time interval, turning on the second laser light source and turning off the first laser light source, wherein the second laser light beam forms the second color light, the second standby region is cut into the transmission path of the first laser light beam formed in the first time interval or the third time interval, and no light spot is formed on the wavelength conversion module by the first laser light beam.

14. The illumination control method as claimed in claim 13, wherein the first standby region comprises a first boundary of one of the at least one wavelength conversion region and one of the at least one non-conversion region, and in the second time interval, a part of the at least one non-conversion region adjacent to the first boundary, the first boundary, and a part of the at least one wavelength conversion region adjacent to the first boundary are sequentially cut into the transmission path of the first laser light beam formed in the first time interval or the third time interval; and the second standby region comprises a second boundary of one of the at least one wavelength conversion region and one of the at least one non-conversion region, and in the fourth time interval, a part of the at least one wavelength conversion region adjacent to the second boundary, the second boundary, and a part of the at least one non-conversion region adjacent to the second boundary are sequentially cut into the transmission path of the first laser light beam formed in the first time interval or the third time interval.

15. The illumination control method as claimed in claim 13, wherein the first standby region comprises a first blank region located between one of the at least one wavelength conversion region and one of the at least one non-conversion region, and in the second time interval, a part of the at least one non-conversion region adjacent to the first blank region, the first blank region, and a part of the at least one wavelength conversion region adjacent to the first blank region are sequentially cut into the transmission path of the first laser light beam formed in the first time interval or the third time interval; and the second standby region comprises a second blank region located between one of the at least one wavelength conversion region and one of the at least one non-conversion region, and in the fourth time interval, a part of the at least one wavelength conversion region adjacent to the second blank region, the second blank region, and a part of the at least one non-conversion region adjacent to the second blank region are sequentially cut into the transmission path of the first laser light beam formed in the first time interval or the third time interval.

16. The illumination control method as claimed in claim 13, wherein the at least one non-conversion region is a light penetration region.

17. The illumination control method as claimed in claim 16, wherein the illumination system further comprises a third laser light source, the third laser light source is configured to provide a third laser light beam, and the illumination control method further comprises:

turning off the third laser light source in the first time interval, the second time interval, the third time interval, and the fourth time interval; and in a fifth time interval, turning on the third laser light source and turning off the first laser light source and the second laser light source, wherein the third laser light source is turned off in the first time interval, the second time interval, the third time interval, and the fourth time interval.

18. The illumination control method as claimed in claim 17, further comprising:

an optical uniforming unit, located on transmission paths of the first laser light beam, the second laser light beam, and the third laser light beam, and the wavelength conversion module is disposed on the transmission path of the third laser light beam.

19. The illumination control method as claimed in claim 18, wherein the wavelength conversion module comprises a first annular region and a second annular region arranged in different radial ranges, the optical uniforming unit is disposed on the first annular region, the at least one wavelength conversion region and the at least one non-conversion region of the wavelength conversion module are disposed on the second annular region, the first laser light beam forms the first color light after sequentially passing through the at least one non-conversion region located on the second annular region and the optical uniforming unit located on the first annular region to, the second laser light beam forms the second color light after passing through the optical uniforming unit located on the first annular region, and the third laser light beam forms a fourth color light after sequentially passing through the optical uniforming unit located on the first annular region and the at least one non-conversion region located on the second annular region.

20. The illumination control method as claimed in claim 18, wherein a ratio of a time length of the third time interval to a time length of the first time interval is between 0.5 and 1.5, a ratio of a time length of the second time interval or the fourth time interval to the time length of the first time interval is between 0.5 and 1.5, and a ratio of a time length of the fifth time interval to the time length of the first time interval is between 1.5 and 3.

21. The illumination control method as claimed in claim 13, wherein the at least one non-conversion region is a light reflection region.

22. The illumination control method as claimed in claim 13, wherein a ratio of a time length of the third time interval to a time length of the first time interval is between 2 and 4, and a ratio of a time length of the second time interval or the fourth time interval to the time length of the first time interval is between 1 and 2.5.

\* \* \* \* \*